(12) United States Patent
Kim et al.

(10) Patent No.: US 11,367,809 B2
(45) Date of Patent: Jun. 21, 2022

(54) LIGHT EMITTING DEVICE PACKAGE

(71) Applicant: SUZHOU LEKIN SEMICONDUCTOR CO., LTD., Taicang (CN)

(72) Inventors: Ki Seok Kim, Seoul (KR); Won Jung Kim, Seoul (KR); June O Song, Seoul (KR); Chang Man Lim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 73 days.

(21) Appl. No.: 16/646,884

(22) PCT Filed: Sep. 12, 2018

(86) PCT No.: PCT/KR2018/010717
§ 371 (c)(1),
(2) Date: Mar. 12, 2020

(87) PCT Pub. No.: WO2019/054760
PCT Pub. Date: Mar. 21, 2019

(65) Prior Publication Data
US 2021/0013376 A1    Jan. 14, 2021

(30) Foreign Application Priority Data

Sep. 12, 2017 (KR) .......... 10-2017-0116359
Nov. 17, 2017 (KR) .......... 10-2017-0153818
Dec. 1, 2017 (KR) .......... 10-2017-0164484

(51) Int. Cl.
*H01L 33/48* (2010.01)
*H01L 33/56* (2010.01)

(52) U.S. Cl.
CPC ............ *H01L 33/486* (2013.01); *H01L 33/56* (2013.01)

(58) Field of Classification Search
CPC ....... H01L 24/32; H01L 33/486; H01L 33/62; H01L 33/60; H01L 33/502; H01L 33/382;
(Continued)

(56) References Cited

U.S. PATENT DOCUMENTS

2006/0027826 A1* 2/2006 Goodrich .............. H01L 33/486
257/99
2007/0085101 A1* 4/2007 Kim ........................ H01L 33/60
257/98
(Continued)

FOREIGN PATENT DOCUMENTS

EP    2 806 471 B1    7/2017
JP    2007-220852 A    8/2007
(Continued)

*Primary Examiner* — Mouloucoulaye Inoussa
(74) *Attorney, Agent, or Firm* — Birch, Stewart, Kolasch & Birch, LLP

(57) ABSTRACT

Embodiments relate to a light emitting device package and a light source device. A light emitting device package according to the embodiment may include a first package body; a second package body disposed on the first package body, and comprising an opening passing through an upper surface and a lower surface of the second package body; and a light emitting device disposed in the opening, and comprising a first bonding part and a second bonding part. The first package body may include a first opening and a second opening that pass through an upper surface and a lower surface of the first package body. The upper surface of the first package body may be coupled with the lower surface of the second package body, the first bonding part may be disposed on the first opening, and the second bonding part may be disposed on the second opening.

20 Claims, 18 Drawing Sheets

(58) Field of Classification Search
CPC ....... H01L 33/44; H01L 33/56; H01L 33/483; H01L 25/167; H01L 33/50; H01L 33/52; H01L 33/505; H01L 25/0753; H01L 24/08; H01L 33/0075; H01L 33/54; H01L 33/24
USPC ....... 257/81, 84, 93, 48, 89, 98, 99; 438/26; 362/293, 297
See application file for complete search history.

(56) References Cited

U.S. PATENT DOCUMENTS

| | | | |
|---|---|---|---|
| 2007/0187706 A1 | 8/2007 | Higashi et al. | |
| 2008/0043444 A1* | 2/2008 | Hasegawa | H05K 1/0206 361/717 |
| 2008/0149962 A1* | 6/2008 | Kim | H01L 25/167 257/99 |
| 2009/0107897 A1* | 4/2009 | Kim | B01D 61/10 210/108 |
| 2009/0273002 A1* | 11/2009 | Chiou | H01L 33/642 257/99 |
| 2011/0031509 A1* | 2/2011 | Kirihara | H01L 33/486 257/81 |
| 2011/0032710 A1* | 2/2011 | Higashi | H01L 33/60 362/296.01 |
| 2013/0181236 A1* | 7/2013 | Tamaki | H01L 33/56 257/88 |
| 2014/0332839 A1 | 11/2014 | Choi et al. | |
| 2015/0028372 A1* | 1/2015 | Nakanishi | H01L 33/486 257/98 |
| 2019/0019926 A1* | 1/2019 | Lee | H01L 33/60 |
| 2019/0019929 A1* | 1/2019 | Lim | H01L 33/502 |
| 2019/0027641 A1* | 1/2019 | Lee | H01L 33/486 |
| 2019/0088837 A1* | 3/2019 | Lee | H01L 33/40 |
| 2019/0207062 A1* | 7/2019 | Kim | H01L 33/60 |
| 2019/0333896 A1* | 10/2019 | Song | H01L 24/32 |
| 2019/0334063 A1* | 10/2019 | Kim | H01L 33/62 |

FOREIGN PATENT DOCUMENTS

| | | |
|---|---|---|
| JP | 2015-226055 A | 12/2015 |
| KR | 10-2011-0123945 A | 11/2011 |
| KR | 10-2012-0056164 A | 6/2012 |
| KR | 10-2015-0145036 A | 12/2015 |
| KR | 10-1590463 B1 | 2/2016 |

* cited by examiner

[FIG. 1]
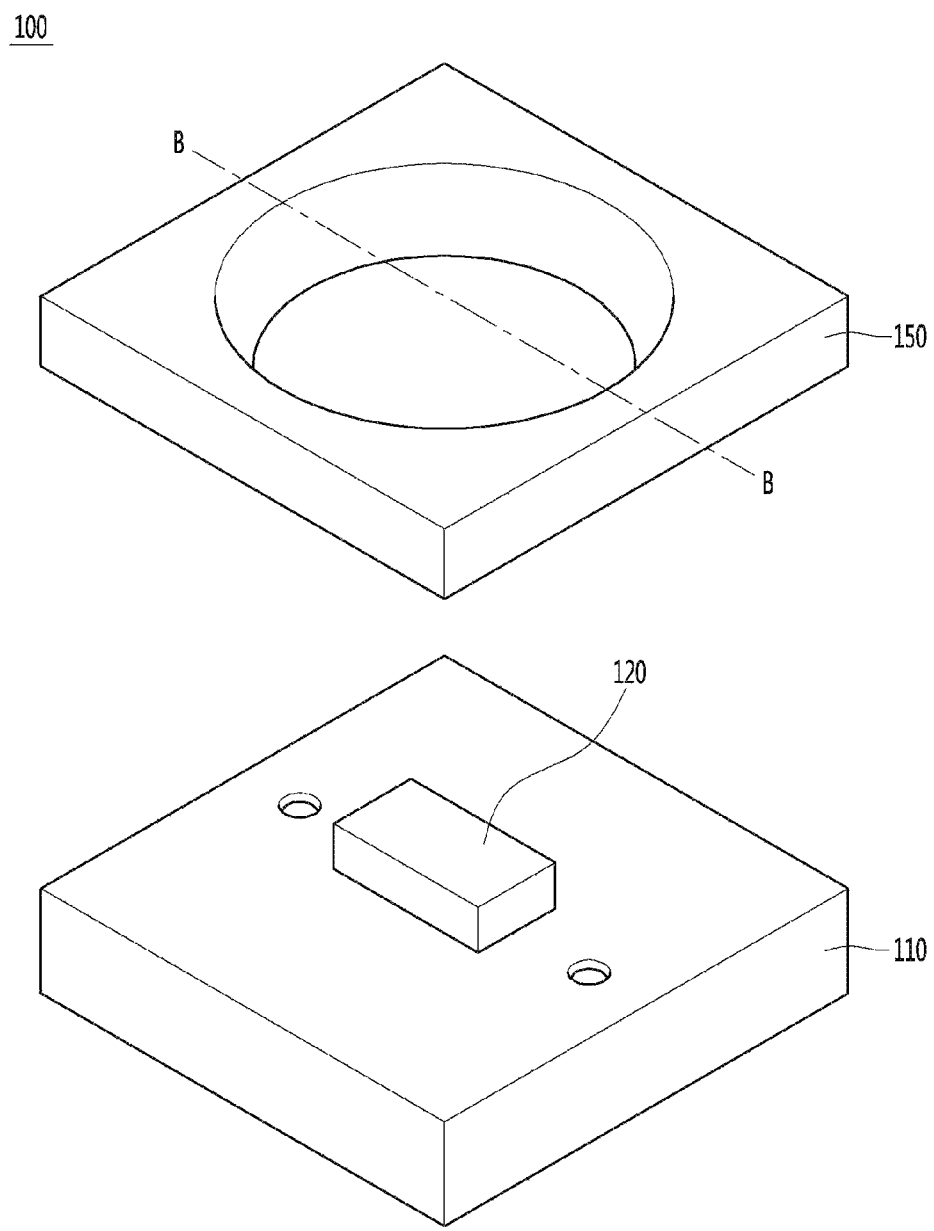

[FIG. 2]
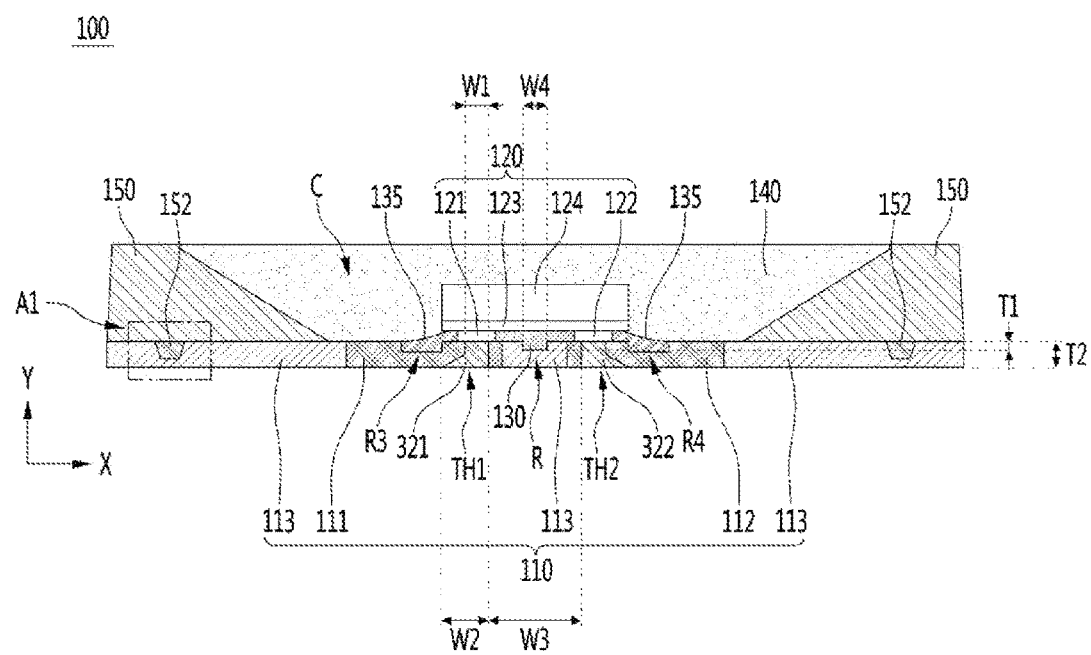
[FIG. 3a]
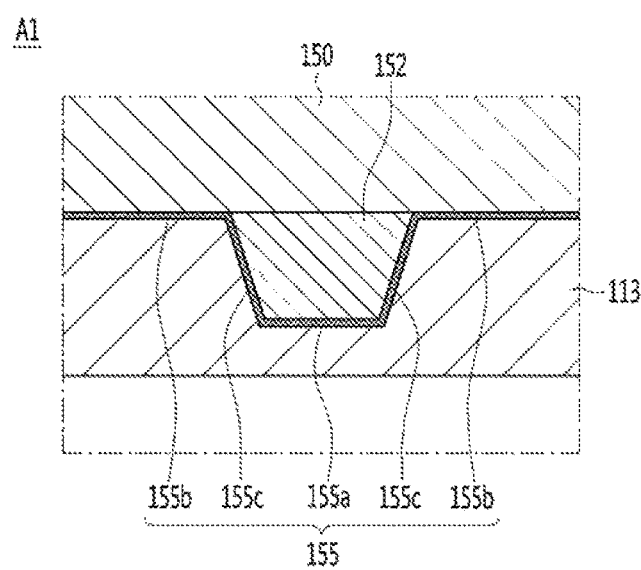

[FIG. 3b]
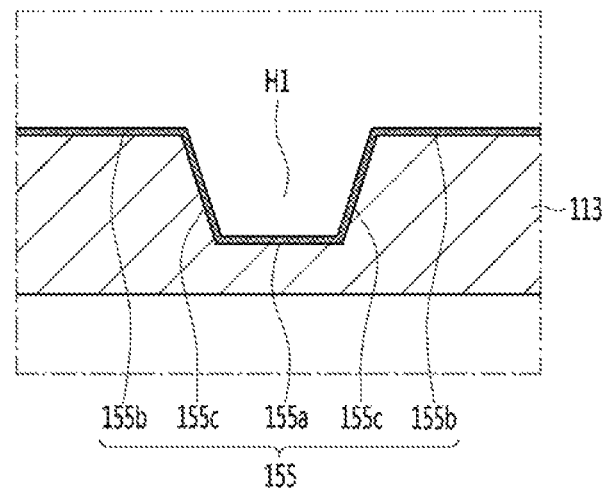
[FIG. 3c]
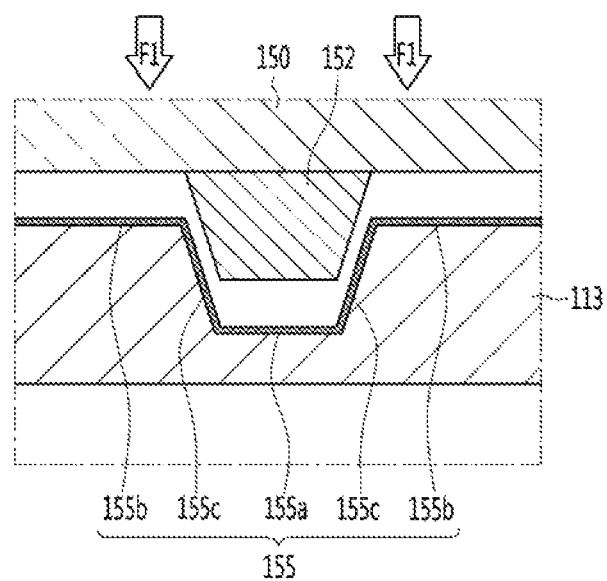

[FIG. 4a]
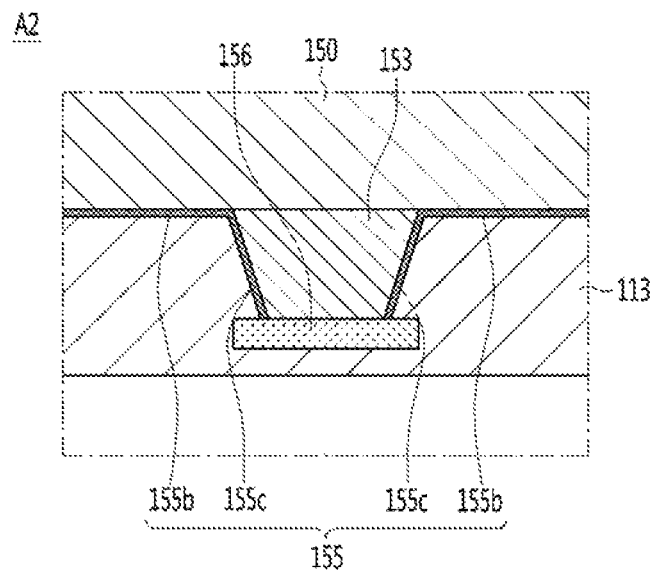
[FIG. 4b]
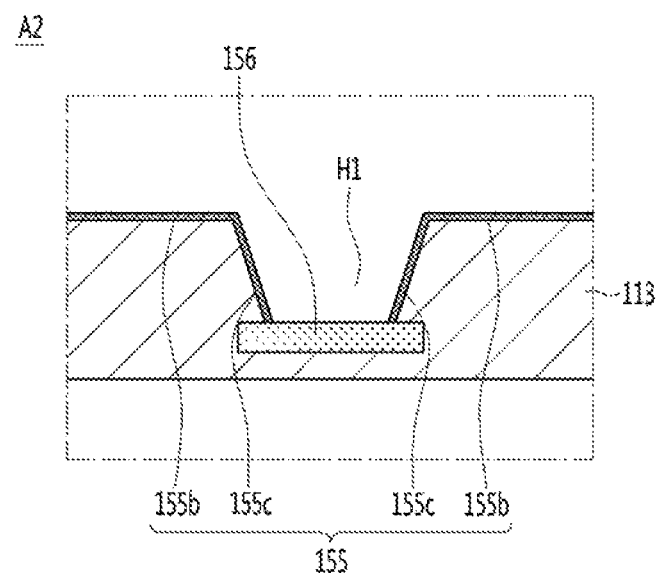

[FIG. 4c]
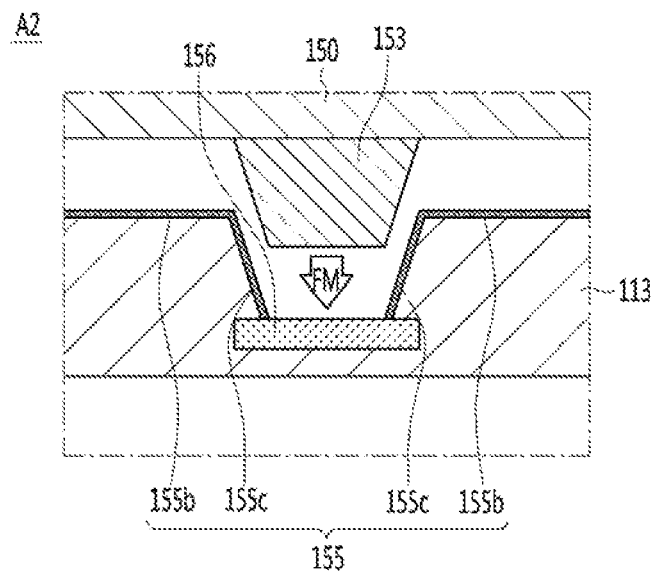
[FIG. 4d]
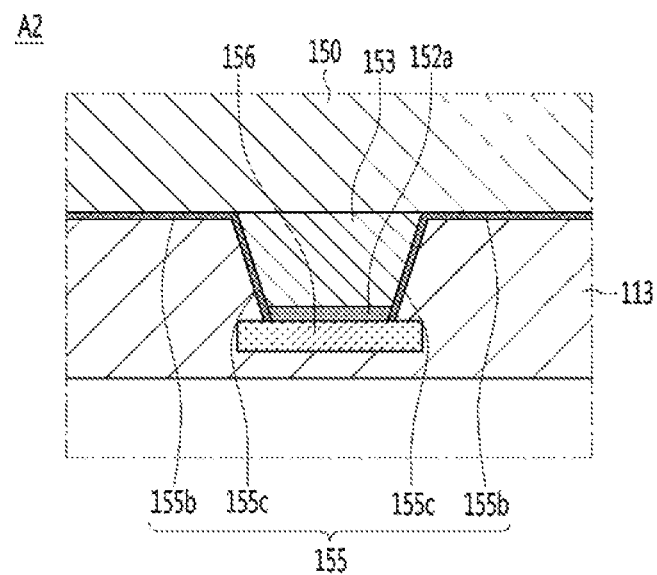

[FIG. 5]
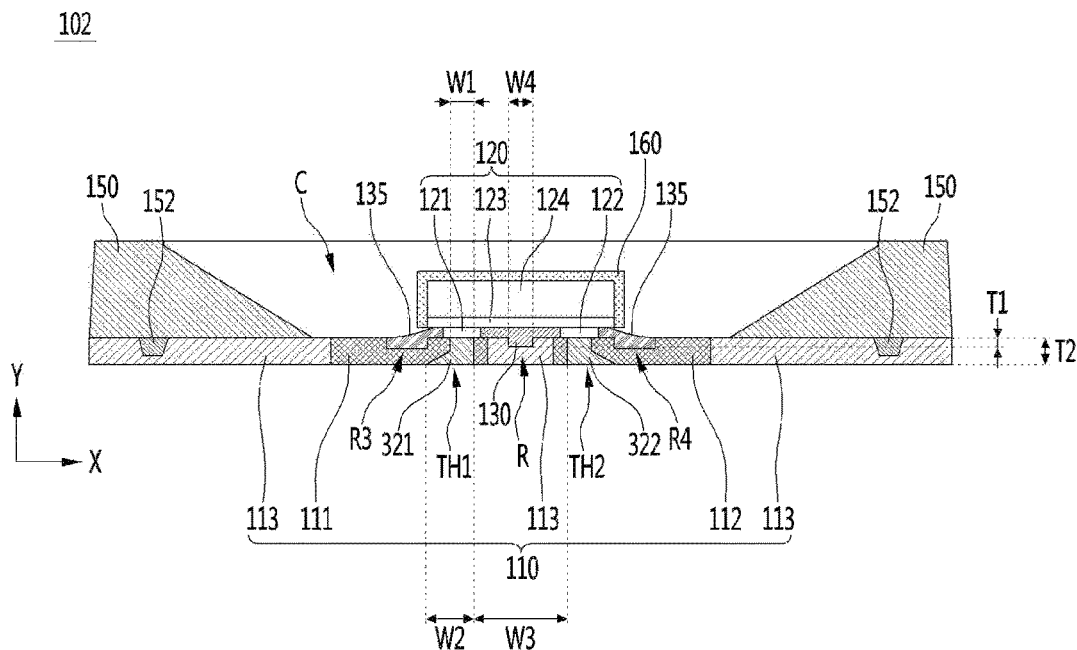
[FIG. 6a]
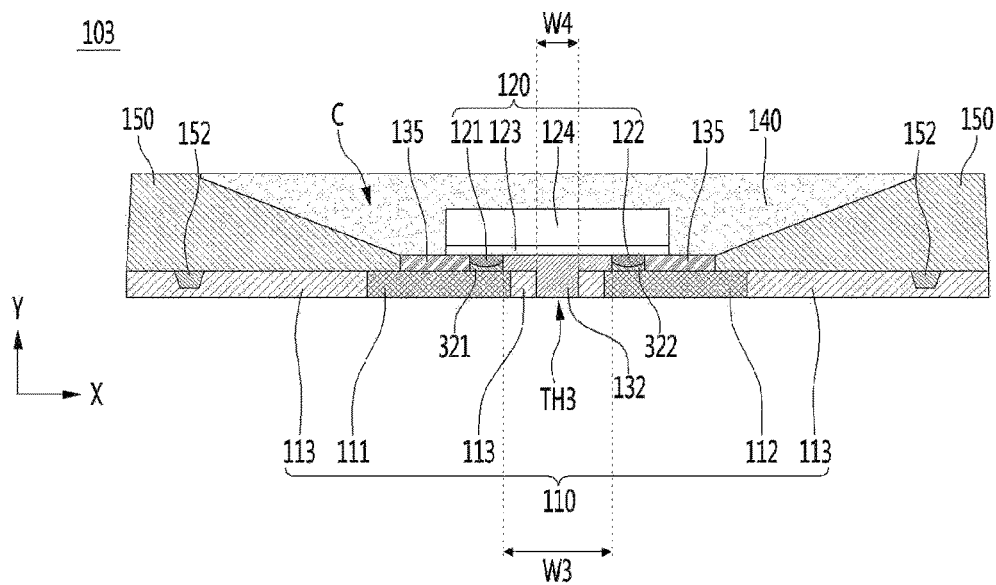

[FIG. 6b]
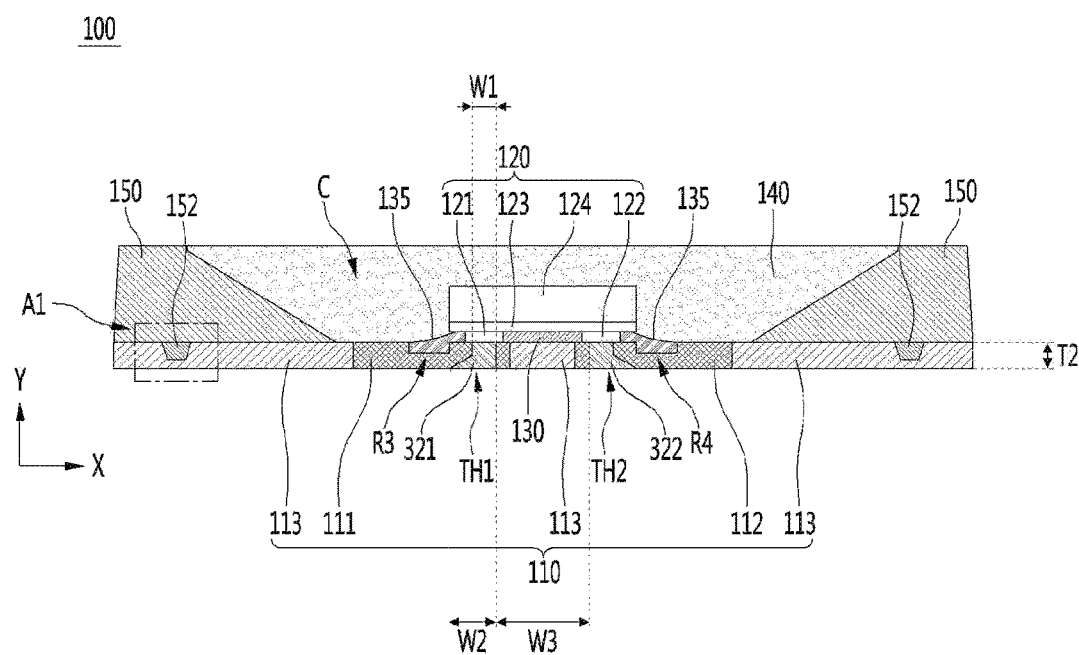

【FIG. 7a】
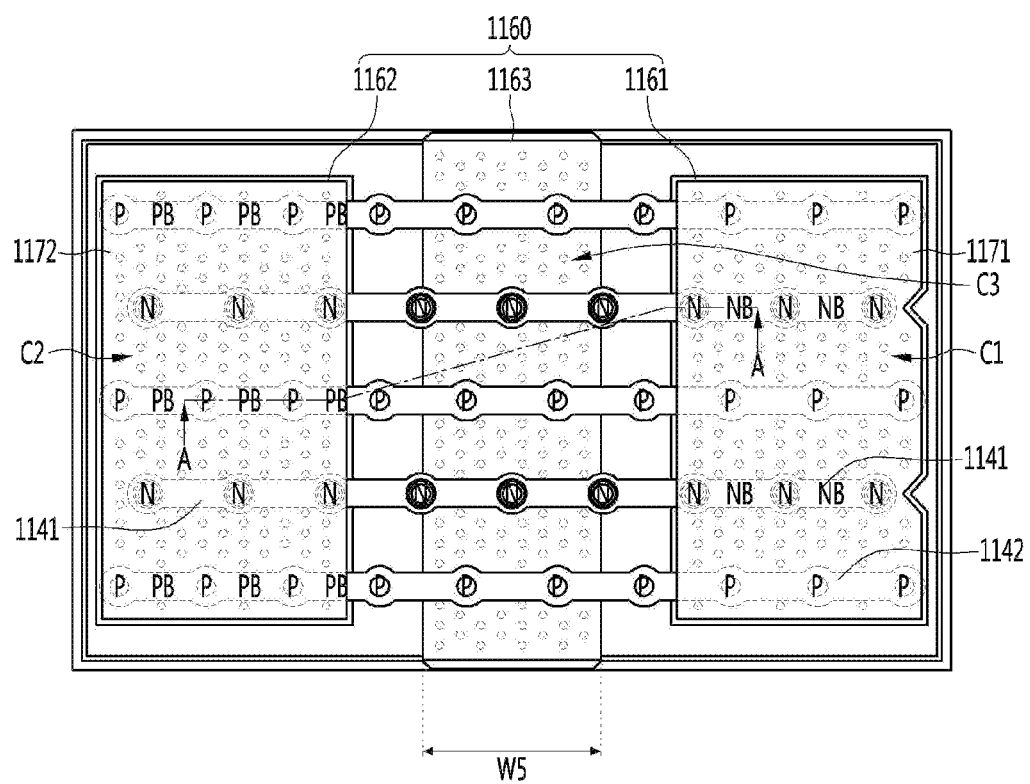

【FIG. 7b】
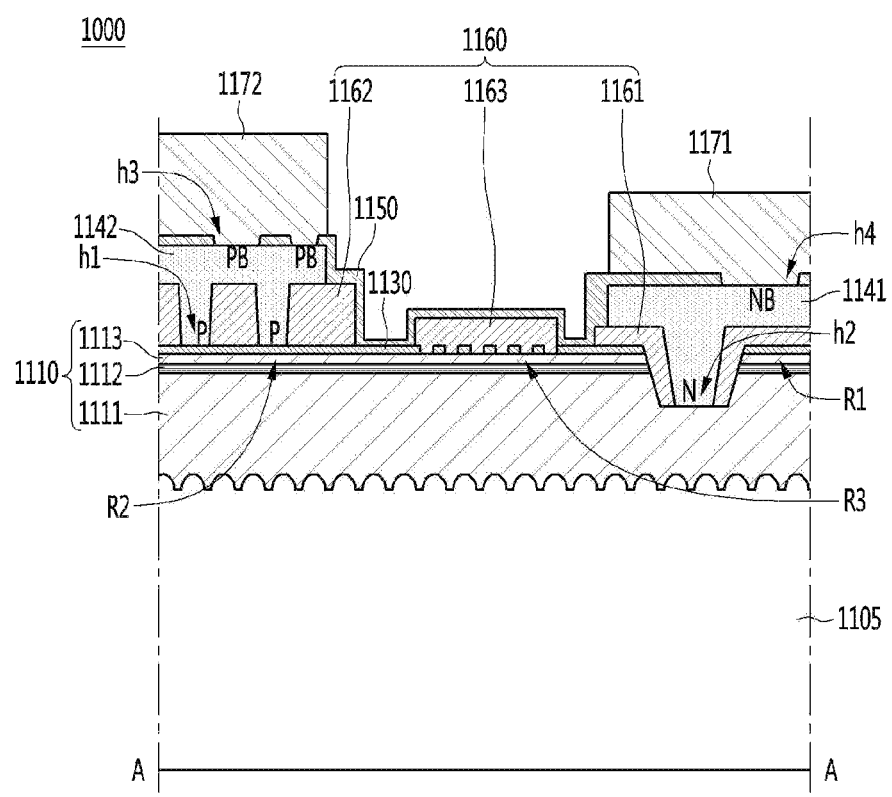

[FIG. 8a]
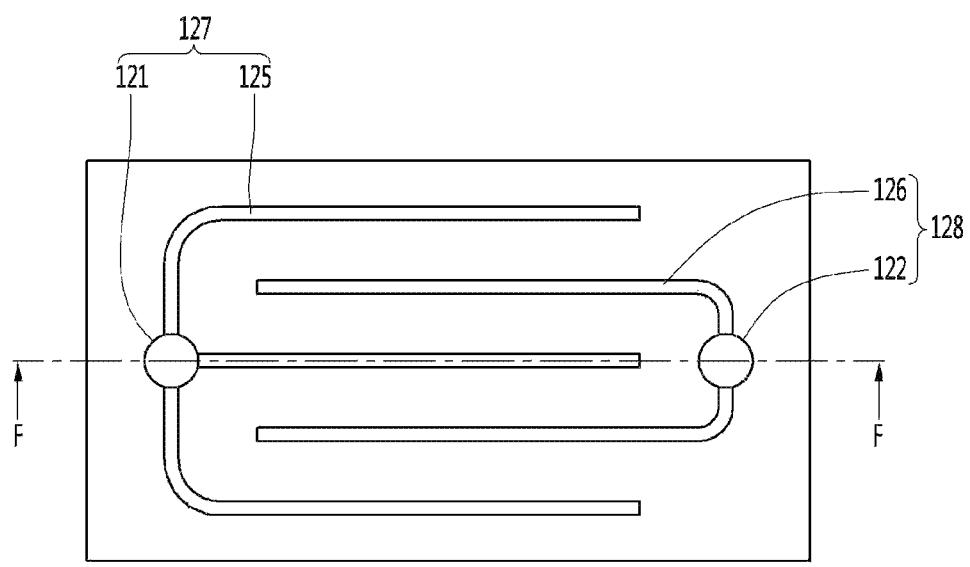
[FIG. 8b]
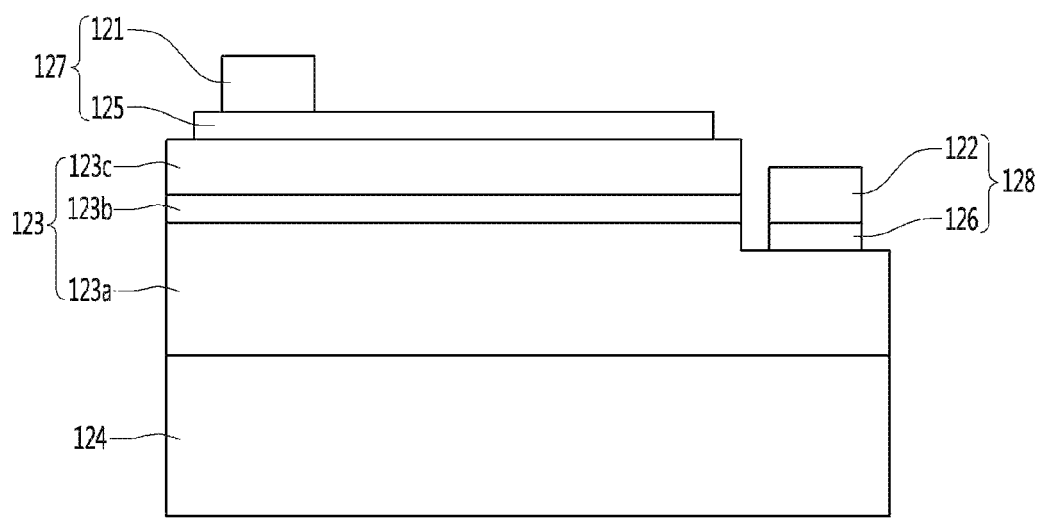

【FIG. 9】
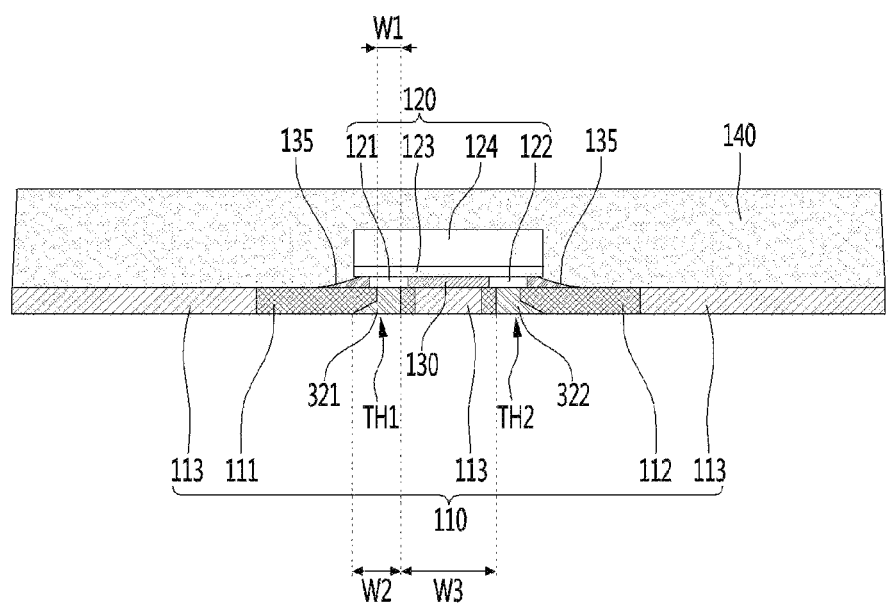
【FIG. 10】
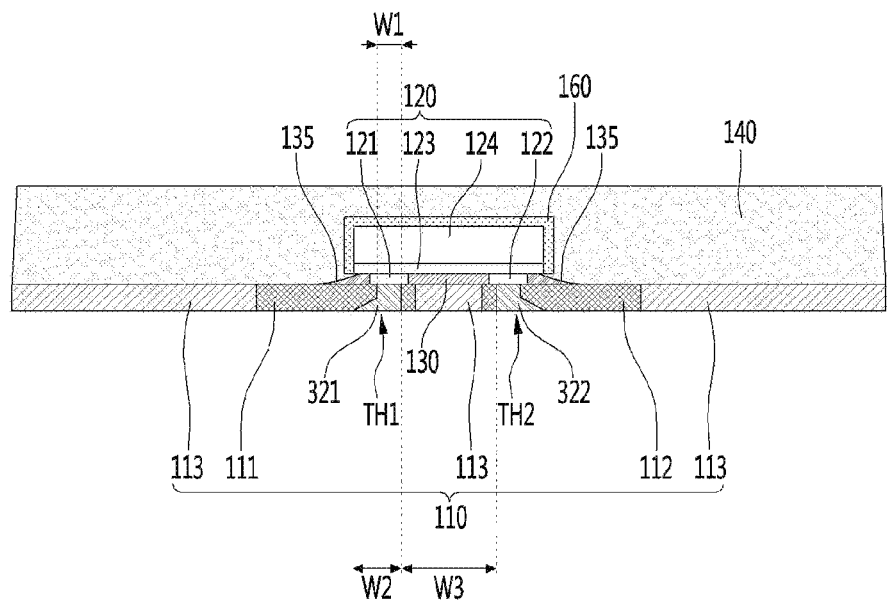

[FIG. 11]
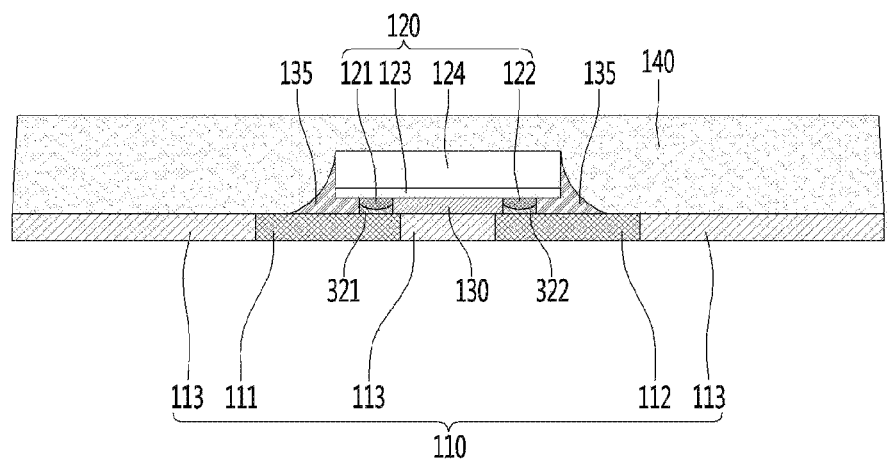
[FIG. 12]
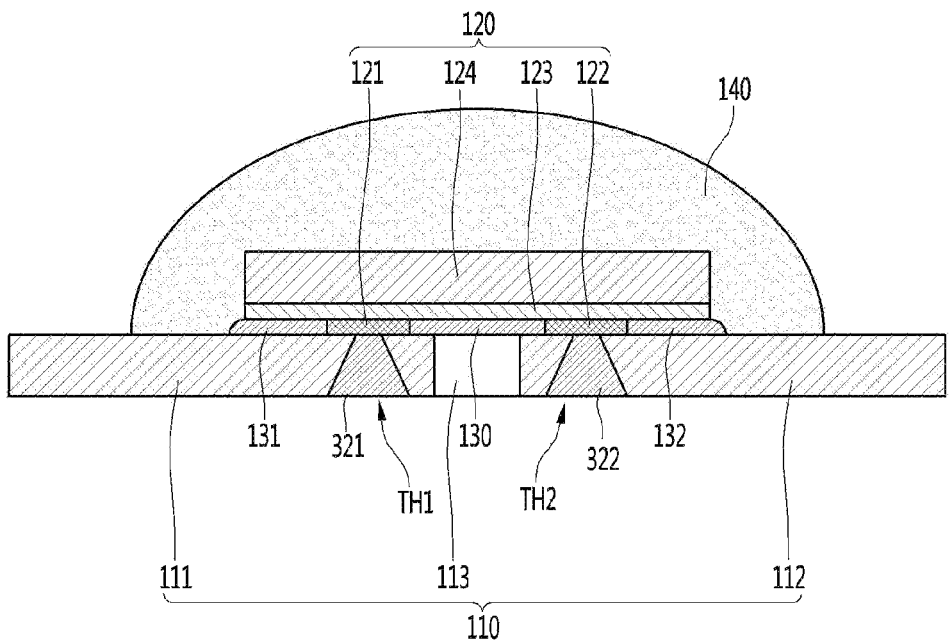

[FIG. 13]
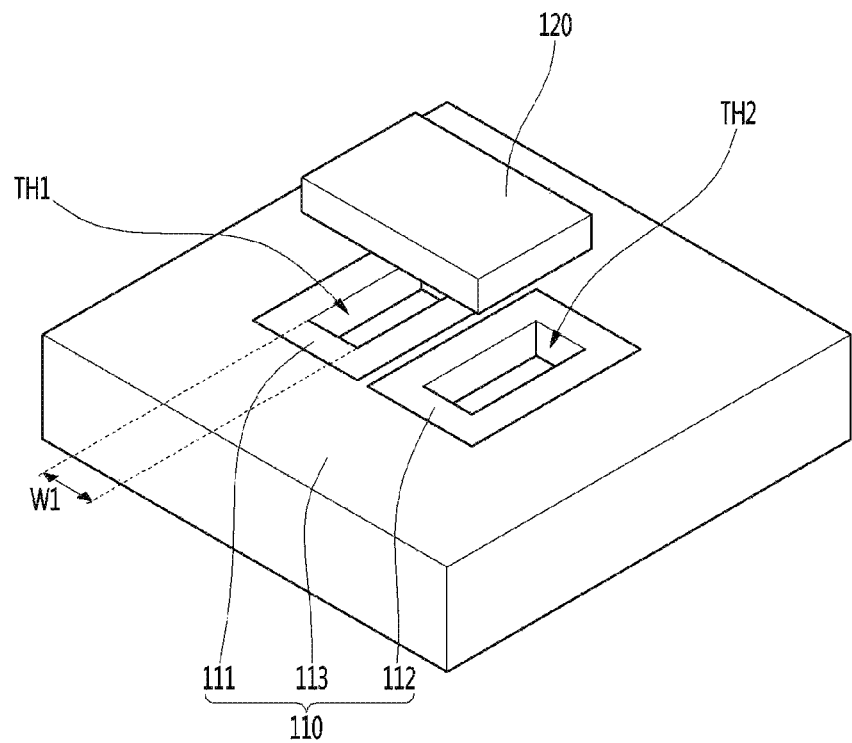

[FIG. 14]
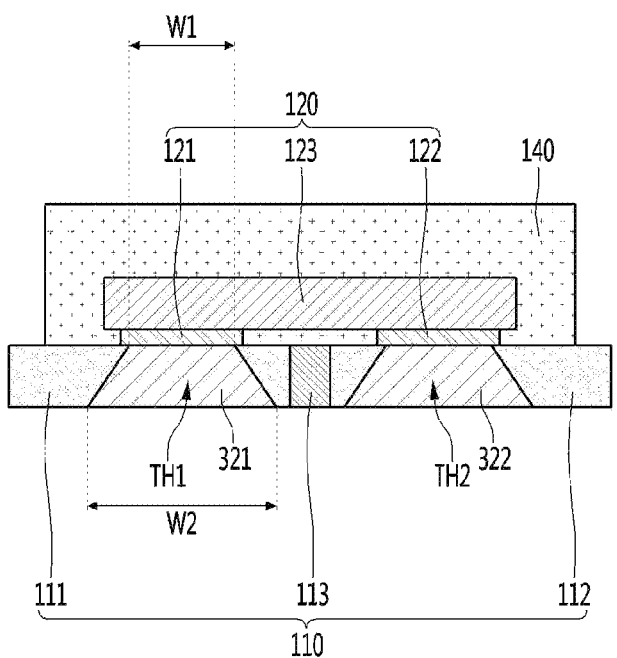

[FIG. 15]
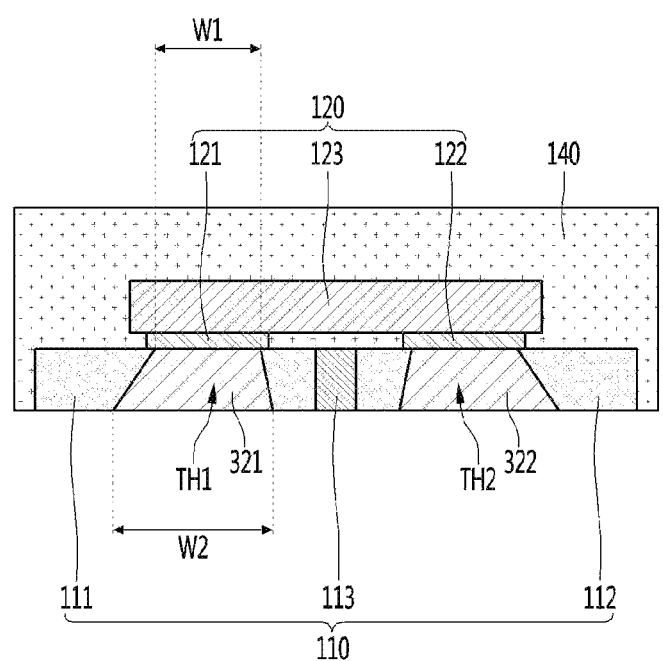

【FIG. 16】
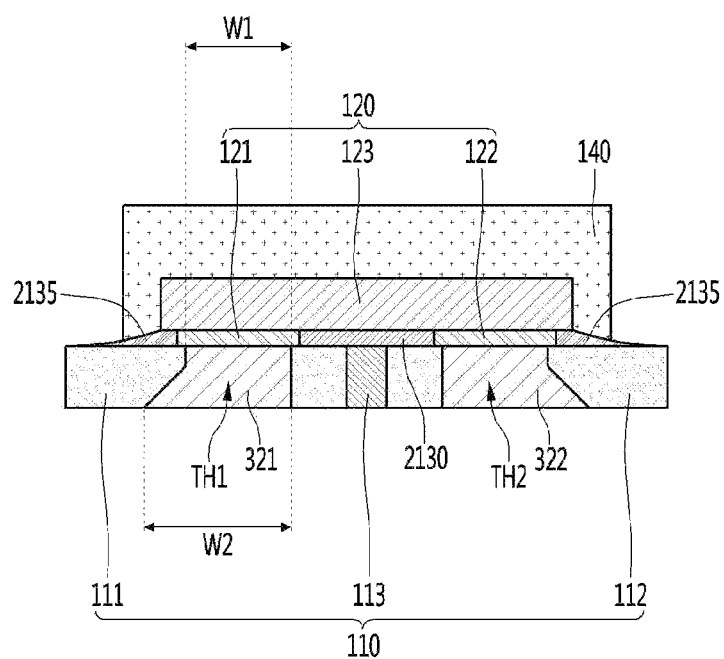

[FIG. 17]
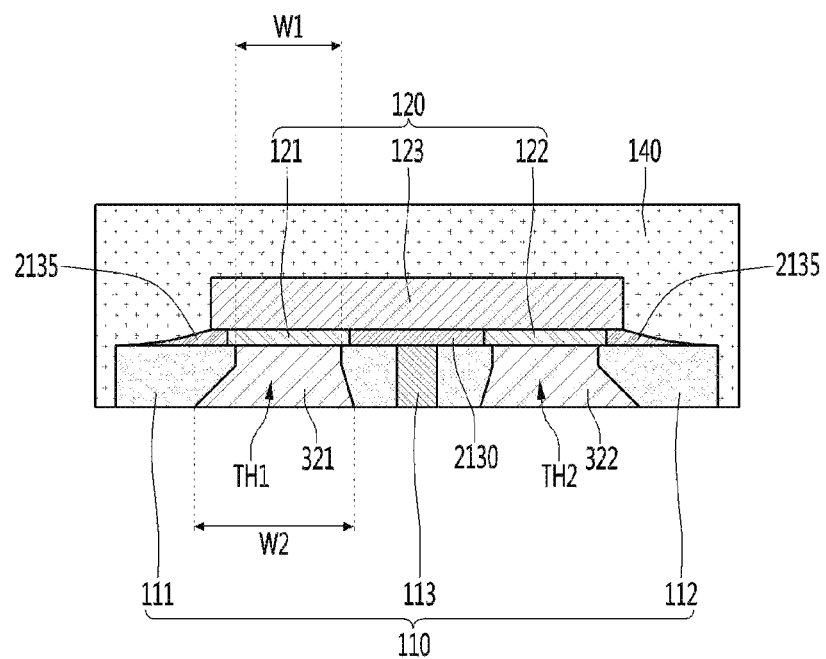
[FIG. 18]
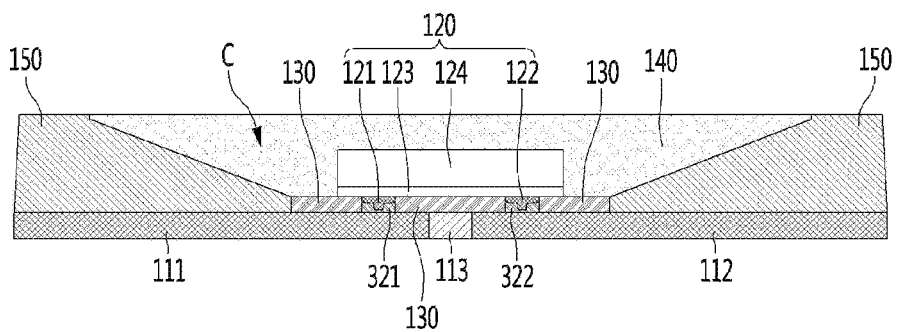

[FIG. 19]
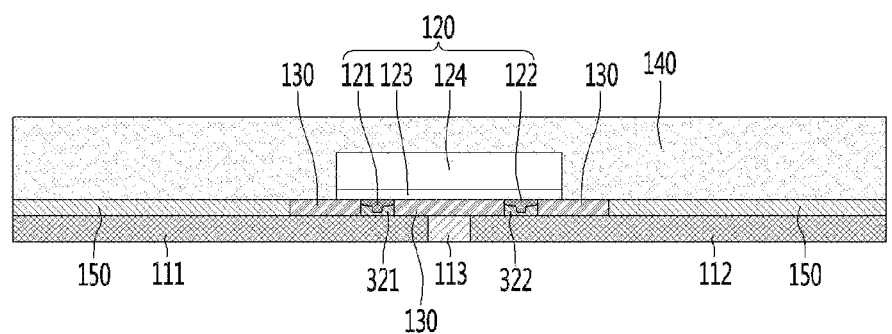

LIGHT EMITTING DEVICE PACKAGE

CROSS REFERENCE TO RELATED APPLICATIONS

This application is the National Phase of PCT International Application No. PCT/KR2018/010717, filed on Sep. 12, 2018, which claims priority under 35 U.S.C. 119(a) to Patent Application Nos. 10-2017-0116359 filed in the Republic of Korea on Sep. 12, 2017; 10-2017-0153818, filed in the Republic of Korea on Nov. 17, 2017 and 10-2017-0164484, filed in the Republic of Korea on Dec. 1, 2017, all of which are hereby expressly incorporated by reference into the present application.

TECHNICAL FIELD

Embodiments relate to a light emitting device package, a method of manufacturing a light emitting device package, and a light source device.

BACKGROUND ART

A semiconductor device comprising compounds such as GaN and AlGaN has many merits such as wide and easily adjustable bandgap energy, so the device can be used variously as light emitting devices, light receiving devices and various kinds of diodes.

In particular, light emitting devices such as light emitting diodes and laser diodes obtained by using a group III-V or a group II-VI compound semiconductor substances can implement light having various wavelength band such as red, green, blue and ultraviolet rays due to the development of thin film growth technology and device materials. In addition, the light emitting devices such as light emitting diodes and laser diodes obtained by using a group III-V or a group II-VI compound semiconductor substances can implement a white light source having high efficiency by using fluorescent substances or combining colors. Such a semiconductor device has advantages such as low power consumption, semi-permanent lifetime, quick response speed, safety, and environmental friendliness compared to conventional light sources such as fluorescent lamps and incandescent lamps.

In addition, when a light receiving device such as a photodetector or a solar cell is manufactured using a group III-V or a group II-VI compound semiconductor substances, a photoelectric current is generated by absorbing light having various wavelength domains with the development of device materials, so that light having various wavelength domains such as from gamma rays to radio waves can be used. In addition, the above light receiving device has advantages such as quick response speed, safety, environmental friendliness and easy control of device materials, so that the light receiving device can be easily used for a power control, a super-high frequency circuit or a communication module.

Accordingly, the semiconductor device has been applied and expanded to a transmission module of an optical communication means, a light emitting diode backlight replacing a cold cathode fluorescence lamp (CCFL) constituting a backlight of a liquid crystal display (LCD), a white light emitting diode lighting apparatus replaceable with a fluorescent lamp or an incandescent bulb, a vehicular headlight, a traffic light and a sensor for detecting gas or fire. In addition, the applications of the semiconductor device can be expanded to a high frequency application circuit, a power control apparatus, or a communication module.

For example, the light emitting device may be provided as a p-n junction diode having a characteristic in which electrical energy is converted into light energy by using a group III-V element or a group II-VI element in the periodic table, and various wavelengths can be realized by adjusting the composition ratio of the compound semiconductor substances.

For instance, a nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been commercialized and extensively used.

For example, an ultraviolet light emitting device may be used as a light emitting diode that emits light distributed in a wavelength range of 200 nm to 400 nm, used for sterilization and purification in the case of a short wavelength in the wavelength band, and used for an exposure machine, a curing machine, or the like in the case of a long wavelength.

Ultraviolet rays may be divided into three groups of UV-A (315 nm to 400 nm), UV-B (280 nm to 315 nm) and UV-C (200 nm to 280 nm) in the order of long wavelength. The UV-A (315 nm to 400 nm) has been applied to various fields such as UV curing for industrial use, curing of printing ink, an exposure machine, discrimination of counterfeit, photocatalytic disinfection, special illumination (aquarium/agriculture and the like), the UV-B (280 nm to 315 nm) has been used for medical use, and the UV-C (200 nm to 280 nm) has been applied to air purification, water purification, sterilization products, and the like.

According to the related art, a light emitting device is mounted on a predetermined package body and utilized as a light emitting device package.

On the other hand, the light emitting device package is used in various fields such as lighting, vehicle lamp, sterilization, medical, plant cultivation, and the like, due to the various uses, manufacturing a light emitting device package body and a lead frame on which a light emitting device is mounted whenever requested by a customer has a disadvantage of being cumbersome and inefficient.

For example, as the difficulty and complexity of the package process increases in views of mass production, a different form factor for each output is required and the complexity of the process increases.

In addition, according to the prior art, there is an issue of bonding coupling force between a package body and a light emitting device, and thus there is a reliability issue due to a decrease in bonding force.

In addition, in the light emitting device package of the prior art, there is an issue of bonding coupling force and reliability of the bonding between an electrode of a package body and a light emitting device.

For example, when a conventional light emitting device package is mounted on a sub-mount or a circuit board, a high temperature process such as a reflow is applied, at this time, in the reflow process, a re-melting phenomenon occurs in the bonding region between the lead frame and the light emitting device provided in the light emitting device package, so there is a problem of electrical and physical reliability because the stability of the electrical connection or physical bonding coupling is weakened.

In addition, as a light emitting device capable of providing a high output is required in current and future technologies, research on a light emitting device capable of increasing output by applying a high power source is being conducted, but a countermeasure is weak. In particular, when high power is applied to the light emitting device, there is a heat dissipation issue due to the heat generation of the light emitting device, which may cause a problem of deterioration of thermal and electrical reliability.

In addition, in the prior art, research is being conducted to improve a light extraction efficiency of a light emitting device and to improve a light intensity at a package stage.

In addition, in the light emitting device package in the prior art, research to improve a manufacturing efficiency and improve a manufacturing yield by improving a process efficiency and structure modification has been in progress.

SUMMARY

One of the technical problems of an embodiment is to provide a light emitting device package, a method of manufacturing the light emitting device package, and a light source device including the light emitting device package, which can efficiently match an optimum specification for each product even when a different form factor is required for each output.

In addition, one of the technical problems of an embodiment is to provide a light emitting device package capable of improving bonding strength between a package body and a light emitting device, a method of manufacturing the light emitting device package, and a light source device including the light emitting device package.

In addition, one of the technical problems of an embodiment is to provide a light emitting device package capable of solving problem of electrical and physical reliability in a bonding region between an electrode of a package body and an electrode of a light emitting device, a method of manufacturing the light emitting device package, and a light source device including the light emitting device package.

In addition, one of the technical problems of an embodiment is to provide a light emitting device package providing a high output and excellent thermal and electrical reliability, a method of manufacturing the light emitting device package, and a light source device including the light emitting device package.

In addition, one of the technical problems of an embodiment is to provide a light emitting device package that can improve brightness, a method of manufacturing the light emitting device package, and a light source device including the light emitting device package.

In addition, one of the technical problems of an embodiment is to provide a light emitting device package, a manufacturing method thereof, and a light source device including the same, which can reduce manufacturing cost and improve manufacturing yield by improving process efficiency and changing a structure.

The technical problems of an embodiments are not limited to those described in this item, but include those that can be understood through the description of the invention.

A light emitting device package according to an embodiment may comprise a first package body; a second package body disposed on the first package body, and comprising an opening passing through an upper surface and a lower surface of the second package body; and a light emitting device disposed in the opening, and comprising a first bonding part and a second bonding part.

The first package body may comprise a first opening and a second opening that pass through an upper surface and a lower surface of the first package body.

The upper surface of the first package body may be coupled with the lower surface of the second package body, the first bonding part may be disposed on the first opening, and the second bonding part may be disposed on the second opening.

In an embodiment, a coupling between the upper surface of the first package body and the lower surface of the second package body may comprise a mechanical coupling or a chemical coupling. For example, the first package body and the second package body may be mechanically coupled by a concave-convex structure, may be chemically coupled by a bonding agent, and may be simultaneously mechanically and chemically coupled.

Embodiments may comprise an adhesive layer disposed between the first package body and the second package body.

The first package body may comprise a first frame, a second frame, and a body disposed between the first frame and the second frame.

The first frame may comprise the first opening, and the second frame may comprise the second opening.

The body may comprise a recess.

At least one of the first package body and the second package body may comprise a phosphor.

At least one of the first package body and the second package body may comprise a transparent resin.

At least one of the first package body and the second package body may comprise a reflective resin.

At least one of the first package body and the second package body may comprise a phosphor, and at least one of the first package body and the second package body may comprise a transparent resin.

At least one of the first package body and the second package body may comprise a phosphor, and at least one of the first package body and the second package body may comprise a reflective resin.

Further, a light emitting device package according to an embodiment may comprise a first package body comprising a body supporting first and second frames spaced apart from each other; a light emitting device disposed on the first package body; a second package body surrounding the light emitting device and disposed on the first package body.

The light emitting device package may comprise an adhesive layer disposed between the first package body and the second package body. The first frame and the second frame may comprise a first opening and a second opening, respectively, and the body may comprise a recess.

In addition, a light emitting device package according to an embodiment may comprise a first package body comprising a body supporting first and second frames spaced apart from each other; a light emitting device disposed on the first package body; a second package body surrounding the light emitting device and disposed on the first package body, and may further comprise an adhesive layer disposed between the first package body and the second package body, wherein the body may comprise a third opening, and wherein a heat dissipation member may be provided in the third opening.

A light source device according to an embodiment may comprise a light emitting unit having the light emitting device package.

Advantageous Effects

According to the embodiments, it is possible to provide a light emitting device package, a method of manufacturing the same, and a light source device including the same, which can efficiently match an optimum specification for each product even when a different form factor is required for each output.

In addition, according to the embodiments, it is possible to provide a light emitting device package capable of improving bonding strength between a package body and a light emitting device, a method of manufacturing the same, and a light source device including the same.

Further, in the embodiments, attraction force according to the magnetic force (FM) is generated between the first magnetic material layer of the first package body and the second magnetic material layer on the second package body, so that the second magnetic material layer of the second package body can be self-aligned to the coupling groove of the first package body, but also be self-attached by the magnetic force, so that there is a technical effect capable of self-alignment and self-attachment between the first package body and the second package body.

In addition, according to the embodiments, it is possible to provide a light emitting device package having an excellent electrical and physical reliability in a bonding region between an electrode of a package body and an electrode of a light emitting device, a method of manufacturing the same, and a light source device including the same.

For example, according to the light emitting device package and the method of manufacturing the light emitting device of the embodiments, there is an advantage that re-melting phenomenon can be prevented from occurring in the bonding region of the light emitting device package while the light emitting device package is re-bonded to a substrate or the like.

In addition, according to the embodiments, it is possible to provide a light emitting device package capable of providing a high output and excellent thermal and electrical reliability, a method of manufacturing the same, and a light source device including the same.

In addition, according to the embodiments, it is possible to provide a light emitting device package capable of improving brightness, a method of manufacturing the same, and a light source device including the same.

In addition, according to the embodiments, it is possible to provide a light emitting device package, a method of manufacturing the same, and a light source device including the same, which can reduce manufacturing cost and improve manufacturing yield by improving process efficiency and changing a structure.

The technical effects of the embodiments are not limited to the matters described in this item and include those that can be understood through the description of the invention.

BRIEF DESCRIPTION OF THE DRAWINGS

FIG. 1 is an exploded perspective view of a light emitting device package according to an embodiment of the present invention.

FIG. 2 is a cross-sectional view of a light emitting device package according to a first embodiment of the present invention.

FIGS. 3a to 3c are partially enlarged first exemplary views of a light emitting device package according to the first embodiment of the present invention.

FIGS. 4a to 4c are partially enlarged second exemplary views of alight emitting device package according to the first embodiment of the present invention.

FIG. 4d is a partially third enlarged exemplary view of a light emitting device package according to the first embodiment of the present invention.

FIG. 5 is a cross-sectional view of a light emitting device package according to a second embodiment of the present invention.

FIG. 6a is a cross-sectional view of a light emitting device package according to a third embodiment of the present invention.

FIG. 6b is a cross-sectional view of a light emitting device package according to a fourth embodiment of the present invention.

FIG. 7a is a plan view showing an example of a light emitting device applied to a light emitting device package according to an embodiment of the present invention.

FIG. 7b is a cross-sectional view taken along line A-A of the light emitting device shown in FIG. 7a.

FIG. 8a is a plan view showing electrode arrangement of a light emitting device applied to a light emitting device package according to an embodiment of the present invention.

FIG. 8b is a cross-sectional view taken along line F-F of the light emitting device shown in FIG. 8a.

FIG. 9 is a view showing another example of a light emitting device package according to an embodiment of the present invention.

FIG. 10 is a view showing another example of a light emitting device package according to an embodiment of the present invention.

FIG. 11 is a view showing another example of a light emitting device package according to an embodiment of the present invention.

FIG. 12 is a view showing another example of a light emitting device package according to an embodiment of the present invention.

FIG. 13 is a view showing another example of a light emitting device package according to an embodiment of the present invention.

FIG. 14 is a view showing another example of a light emitting device package according to an embodiment of the present invention.

FIG. 15 is a view showing another example of a light emitting device package according to an embodiment of the present invention.

FIG. 16 is a view showing another example of a light emitting device package according to an embodiment of the present invention.

FIG. 17 is a view showing another example of a light emitting device package according to an embodiment of the present invention.

FIG. 18 is a view showing another example of a light emitting device package according to an embodiment of the present invention.

FIG. 19 is a view showing another example of a light emitting device package according to an embodiment of the present invention.

DETAILED DESCRIPTION

Hereinafter, embodiments that can be specifically realized for solving the above problems will be described with reference to the accompanying drawings.

In the description of the embodiments, when described as being formed on "on or under" of each element, the on or under includes both the two elements are in direct contact with each other, or one or more other elements are formed between the two elements. In addition, when expressed as "on" or "under", it may include the meaning of the downward direction as well as the upward direction based on one element.

Semiconductor device may comprise various electronic devices such as a light emitting device and a light receiving device, and each of the light emitting device and the light receiving device may comprise a first conductivity type semiconductor layer, an active layer, and a second conductivity type semiconductor layer. The semiconductor device according to an embodiment may be a light emitting device.

The light emitting device emits light by recombination of electrons and holes, and the wavelength of the light is determined by the energy band gap inherent in the material. Therefore, the light emitted from the light emitting device may be determined according to the composition of the material included in the active layer.

Embodiment 1

FIG. 1 is an exploded perspective view of a light emitting device package 100 according to an embodiment of the present invention, and FIG. 2 is a cross-sectional view taken along line B-B of the light emitting device package 100 according to the first embodiment shown in FIG. 1.

Referring to FIG. 1, the light emitting device package 100 according to the embodiment may comprise a first package body 110, a light emitting device 120 disposed on the first package body 110, and a second package body 150 disposed on the first package body 110 and surrounding the light emitting device 120.

The light emitting device package 100 according to the embodiment may comprise the first package body 110 and the second package body 150 that are separately prepared and selectively assembled to satisfy characteristics required by an application product, and can be manufactured in a modular manner. Thus, according to the embodiments, it is possible to provide a light emitting device package, a method of manufacturing the light emitting device package, and a light source device including the light emitting device package, which can efficiently match an optimum specification for each product even when a different form factor is required for each output.

With reference to FIG. 2, the technical features of the light emitting device package 100 according to the first embodiment will be described in more detail.

<A Body, a Recess of a Body, a First Resin Part>

Referring to FIG. 2, in an embodiment, the first package body 110 may comprise a body 113, and a first frame 111 and a second frame 112 spaced apart from each other. The light emitting device 120 may comprise a first bonding part 121 and a second bonding part 122, may be disposed on the body 113, and may be electrically connected to the first frame 111 and the second frame 112.

The body 113 may be disposed between the first frame 111 and the second frame 112. The body 113 may function as an electrode separation line. The body 113 may be referred to as an insulating member.

The first package body 110 may comprise a transparent resin or a reflective resin. For example, the body 113 may be formed of at least one material selected from a group including polyphthalamide (PPA), polychloro tri phenyl (PCT), liquid crystal polymer (LCP), polyamide 9T (PA9T), silicone, epoxy molding compound (EMC), Silicon molding compound (SMC), ceramic, photo sensitive glass (PSG), sapphire ($Al_2O_3$), and the like.

In addition, the body 113 may comprise a high refractive index filler such as $TiO_2$ and $SiO_2$.

In addition, the body 113 may comprise a phosphor itself.

In addition, the first package body 110 may comprise a transparent resin or a reflective resin, and may further comprise a fluorescent material.

One of the technical problems of the embodiments is to provide a light emitting device package capable of improving bonding strength between a package body and a light emitting device, a method of manufacturing the same, and a light source device including the same.

In order to solve such a technical problem, the light emitting device package 100 according to the embodiment may comprise a recess R provided in an upper region of the body 113, as shown in FIG. 2. A first resin part 130 may be disposed in the recess R.

For example, in the embodiment, the body 113 may comprise a recess R formed in the upper region between the first frame 111 and the second frame 112.

The recess R may be recessed in a downward direction from an upper surface of the body 113. The recess R may be disposed under the light emitting device 120.

The embodiment may comprise a first resin part 130 disposed in a recess R of the body 113. The first resin part 130 may be disposed between the light emitting device 120 and the body 113 to increase the bonding force between the body 113 and the light emitting device 120.

The first resin part 130 may comprise at least one of an epoxy-based material, a silicone-based material, and a hybrid material including an epoxy-based material and a silicone-based material.

Accordingly, the first resin part 130 can provide a stable fixing force between the light emitting device 120 and the package body 110.

According to the embodiments, it is possible to provide a light emitting device package capable of improving the bonding strength between the package body and the light emitting device, a method of manufacturing the same, and a light source device including the same.

The first resin part 130 may be disposed in direct contact with the upper surface of the body 113. Also, the first resin part 130 may be disposed in direct contact with the lower surface of the light emitting device 120.

In addition, in the embodiment, when the light is emitted to the lower surface of the light emitting device 120, the first resin part 130 provides a light diffusion function between the light emitting device 120 and the body 113, so that light extraction efficiency of the light emitting device package 100 can be improved.

In addition, in the embodiment, the first resin part 130 may reflect light emitted from the light emitting device 120. When the first resin part 130 includes a reflection function, the first resin part 130 may comprise a material including $TiO_2$, silicone, and the like, and the first resin part 130 may comprise white silicone.

Accordingly, embodiments can provide a light emitting device package capable of improving brightness, a method of manufacturing the same, and a light source device including the same.

In addition, the first resin part 130 may be formed to have a width larger than a width of the light emitting device 120, and may extend to the outside of the light emitting device 120, in this case, it is possible to prevent electrical short circuits and improve electrical reliability by blocking side expansion of paste or the like during the bonding process.

Referring to FIG. 2, in the embodiment, a depth T1 of the recess R may be determined in consideration of the adhesive strength of the first resin part 130 and may be determined by taking into consideration the stable strength of the body 113, or may be determined that no crack occurs in the light emitting device package 100 due to the heat emitted from the light emitting device 120.

The recess R may provide a suitable space under the light emitting device 120 in which a kind of under-fill process may be performed. The under-fill process may be a process of mounting the light emitting device 120 on the package body 110 and then disposing the first resin part 130 under the light emitting device 120.

Alternatively, in the process of mounting the light emitting device 120 on the package body 110, the under-fill process may be a process of disposing the light emitting device 120 after the first resin part 130 is disposed in the recess R in order to be mounted through the first resin part 130.

Referring to FIG. 2, the depth T1 and the width W4 of the recess R may influence the forming position and fixing force of the first resin part 130. For example, the depth T1 and the width W4 of the recess R may be determined so that a sufficient fixing force can be provided by the first resin part 130 disposed between the body 113 and the light emitting device 120.

By way of example, the depth T1 of the recess R may be provided by several tens of micrometers. The depth T1 of the recess R may be provided in a range of 40 micrometers to 60 micrometers.

In addition, the width W4 of the recess R may be provided as several tens of micrometers to several hundreds of micrometers. The width W4 of the recess R may be provided in the major axis direction of the light emitting device 120 to secure a fixing force between the light emitting device 120 and the package body 110.

The width W4 of the recess R may be narrower than the gap between the first bonding part 121 and the second bonding part 122 of the light emitting device 120. The width W4 of the recess R with respect to the major axis length of the light emitting device 120 may be provided in a range of 5% or more to 80% or less.

When the width W4 of the first recess R is 5% or more of the major axis length of the light emitting device 120, a stable fixing force between the light emitting device 120 and the package body 110 is ensured. Also, when the width W4 of the first recess R is 80% or less of the major axis length of the light emitting device 120, the first resin part 130 may be disposed in each of the first and second frames 111 and 112 between the recess R and the first and second openings TH1 and TH2. Accordingly, the fixing force between the light emitting device 120 and the first and second frames 111 and 112 which are disposed between the recess R and the first and second openings TH1 and TH2 can be secured.

Accordingly, in the embodiment, it is possible to provide a light emitting device package capable of improving the bonding strength between the package body and the light emitting device, a method of manufacturing the same, and a light source device including the same.

In addition, according to the embodiments, it is possible to provide a light emitting device package capable of improving brightness, a method of manufacturing the same, and a light source device including the same.

<Coupling Structure Between a First Package Body and a Second Package Body>

Hereinafter, a coupling structure between the first package body 110 and the second package body 150 according to the embodiment will be described with reference to FIGS. 2, 3a to 3c, and 4a to 4d.

The second package body 150 may comprise a transparent resin or a reflective resin. For example, the body 113 may comprise at least one transparent resin selected from a group including polyphthalamide (PPA), polychloro tri phenyl (PCT), liquid crystal polymer (LCP), polyamide 9T (PA9T), silicone, epoxy molding compound (EMC), silicone molding compound (SMC), ceramic, photo sensitive glass (PSG), sapphire ($Al_2O_3$), and the like.

In addition, the second package body 150 may comprise a high refractive index filler such as $TiO_2$ and $SiO_2$.

In addition, the second package body 150 may comprise a phosphor itself.

In addition, the second package body 150 may comprise a transparent resin or a reflective resin and may further comprise a phosphor.

FIGS. 3a to 3c are enlarged first exemplary views of a portion A1 of a light emitting device package according to a first embodiment.

Referring to FIG. 3a, the embodiment may include an adhesive layer 155 disposed between the first package body 110 and the second package body 150, so that the coupling force between the first package body 110 and the second package body 150 can be strengthened.

At this time, as shown in FIG. 3b, in the embodiment, the first package body 110 may include a coupling groove H1, and as shown in FIG. 3a, the second package body 150 may have a coupling protrusion 152, thereby the coupling force can be increased and the side strength can be increased.

Referring to FIG. 3a, the adhesive layer 155 may comprise a first adhesive layer 155a disposed in the coupling groove H1. For example, the embodiment may comprise the first adhesive layer 155a on a lower surface of the coupling groove H1 to increase the coupling force with the lower surface of the coupling protrusion 152.

In addition, the adhesive layer 155 may comprise a second adhesive layer 155b disposed on the body 113. For example, the embodiment can improve the coupling force between the second package body 150 and the first package body 110 by forming the second adhesive layer 155b on the body 113. Coupling may be performed in a form in which the second adhesive layer 155b is formed on the lower surface of the second package body 150.

In addition, the adhesive layer 155 may comprise a third adhesive layer 155c disposed on a side surface of the coupling groove H1. For example, in the embodiment, the third adhesive layer 155c may be disposed on the side surface of the coupling groove H1 to improve the coupling force with the coupling protrusion 152 of the second package body 150.

The adhesive layer 155 may beat least one selected from a pressure-sensitive adhesive, a chemically reactive adhesive, and a thermosetting adhesive.

For example, the adhesive layer 155 may be a pressure-sensitive adhesive, when a pressure F1 is applied to the second package body 150 to be coupled to the first package body 110 as shown in FIG. 3c, strong coupling force between the second package body 150 and the first package body 110 can be generated by the pressure-sensitive adhesive. Accordingly, the second package body 150 can be strongly coupled to the first package body 110.

In embodiments, the pressure-sensitive adhesive may exhibit a high adhesive strength value and may support a weight of several Kg per $cm^2$ of contact area even at high temperature. A strong coupling force between the first package body 110 and the second package body 150 can be generated and which can be coupled with each other by the pressure-sensitive adhesive in addition to the mechanical coupling force of the coupling protrusion 152 to the coupling groove H1. The pressure-sensitive adhesive may be a polymer. For example, the pressure-sensitive adhesive may be an acrylate-based polymer, but is not limited thereto.

Further, the adhesive layer 155 may be an adhesive material through a chemical reaction. For example, the adhesive layer 155 may comprise at least one of a polyester resin, a polyol, and an acrylic polymer.

In addition, the adhesive layer 155 may be a thermosetting or photo-curable adhesive. For example, the adhesive layer 155 may be an ultraviolet (UV) light curable adhesive, and may comprise one or more of epoxy, urethane, or polyimide.

In addition, the adhesive layer 155 may comprise at least one of an epoxy-based material, a silicone-based material, and a hybrid material including a silicone-based material and an epoxy-based material, to increase the coupling force.

Then, FIGS. 4a to 4c are enlarged second exemplary views A2 of a partial portion of the light emitting device package according to the first embodiment.

The embodiment shown in FIG. 4a may employ the features of the embodiment shown in FIG. 3a, and hereafter it will be described with reference to the features shown in FIG. 4a.

In the embodiment, the first package body 110 may comprise a first magnetic material layer 156 and the second package body 150 may comprise a second magnetic material layer 153 at a region corresponding to the first magnetic material layer 156. Accordingly, the automatic alignment and the automatic coupling between the first package body 110 and the second package body 150 can be performed, so that the efficiency and accuracy of the process can be greatly improved.

Referring to FIGS. 4b and 4c, a magnetic force FM is generated between the first magnetic material layer 156 of the first package body 110 and the second magnetic material layer 153 of the second package body 150, so that the second magnetic material layer 153 may be self-aligned to the coupling groove H1 of the first package body 110. Accordingly, there is a technical effect that self-alignment between the first package body 110 and the second package body 150 can be performed as shown in FIG. 4a.

In addition, according to the embodiment, the second package body 150 can be self-aligned on the first package body 110, and can be automatically coupled by the magnetic force, so that there is a technical effect that self-alignment and self-attachment between the first package body 110 and the second package body 150 are possible.

In the embodiment, the first magnetic material layer 156 formed on the first package body 110 may be ferromagnetic material, but is not limited thereto. For example, in the embodiment, the first magnetic material layer 156 may be formed as a single layer or a multilayer including at least one of Ni, Co, and Fe. The first magnetic material layer 156 may be formed using a plating method, an E-beam method, a sputter method, or the like, and selective deposition may be performed by a photolithography method.

Meanwhile, in the embodiment, the second magnetic material layer 153 formed on the second package body 150 may be a permanent magnet, but is not limited thereto. For example, when the first magnetic material layer 156 is a permanent magnet, the second magnetic material layer 153 may be a ferromagnetic material. In addition, both the first magnetic material layer 156 and the second magnetic material layer 153 may be permanent magnets.

When the second magnetic material layer 153 is a permanent magnet material, it may be a ferrite such as $MnFe_2O_4$. When the second magnetic material layer 153 is a permanent magnet material, it may be a hardened magnet such as tungsten steel, chromium steel, KS steel or the like, and may be a precipitation hardened magnet such as MK steel, Alunico (an alloy of Aluminum, Nickel, Cobalt, and Copper), New KS steel, Cunife (an alloy of Copper, Nickel, and iron), and the like, but is not limited thereto.

Accordingly, in an embodiment, the attraction force due to the magnetic force FM may be generated between the first magnetic material layer 156 of the first package body 110 and the second magnetic material layer 153 on the second package body 150. Not only the second magnetic material layer 156 of the second package body 150 can be automatically aligned in the coupling groove H1 of the first package body 110, but also which can be automatically coupled by the magnetic force, so that there is a technical effect that automatic alignment and automatic attachment between the first package body 110 and the second package body 150 can be performed.

The embodiment may comprise an adhesive layer 155 between the first package body 110 and the second package body 150. The adhesive layer 155 may be a pressure sensitive adhesive, a chemically reactive adhesive material, or a thermosetting adhesive.

For example, the adhesive layer 155 may be a pressure-sensitive adhesive, and as shown in FIG. 4c, a magnetic attractive force (FM) may be generated between the second magnetic material layer 153 of the second package body 150 and the first magnetic material layer 156 of the first package body 110. Accordingly, a strong coupling force can be generated between the second package body 150 and the first package body 110, so that the second package body 150 may be strongly coupled to the first package body 110 by chemical coupling force as well as magnetic force.

FIG. 4d is an enlarged third exemplary view A2 of a partial portion of the light emitting device package according to the first embodiment.

The embodiment shown in FIG. 4d may employ the technical features of the embodiment shown in FIGS. 4a to 4c.

The embodiment shown in FIG. 4d may comprise a third magnetic material layer 152a at a lower portion of the coupling protrusion 152 so that the third magnetic material layer 152a can be automatically aligned with and automatically attached to the first magnetic material layer 156 by magnetic force. There is a complex effect that the side of the coupling protrusion 152 can be firmly coupled with the first package body 110 by the adhesive layer 155.

<First and Second Frames, Light Emitting Device, Opening of Frame, Conductive Layer of Opening>

In addition, one of the technical problems of an embodiment is to provide a light emitting device package capable of solving problem of electrical and physical reliability in a bonding region between an electrode of a package body and an electrode of a light emitting device, a method of manufacturing the same, and a light source device including the same.

In addition, one of the technical problems of an embodiment is to provide a light emitting device package providing a high output and excellent thermal and electrical reliability, a method of manufacturing the same, and a light source device including the same.

Referring again to FIG. 2, the embodiment may comprise a first frame 111 and a second frame 112 spaced from each other. Further, the embodiment may comprise three, four or more frames.

The first frame 111 and the second frame 112 can stably provide the structural strength of the package body 110 in the embodiment. The first frame 111 and the second frame 112 may be formed of a conductive material and electrically connected to the light emitting device, but the present invention is not limited thereto.

For example, the first frame 111 and the second frame 112 may comprise one material or an alloy thereof selected from a group including Cu, Ag, Au, Pt, and the like.

At this time, the first frame 111 and the second frame 112 may be directly powered from electrodes of a separated circuit board.

The light emitting device 120 may be disposed in the cavity C provided by the second package body 115. The cavity C may be referred to as an opening passing through a portion of the upper and lower surfaces of the second package body 150.

The light emitting device 120 may comprise a first bonding part 121, a second bonding part 122, a light emitting structure 123, and a substrate 124.

As shown in FIG. 2, the light emitting device 120 may comprise the light emitting structure 123 disposed under the substrate 124. The first and second bonding parts 121 and 122 may be disposed between the light emitting structure 123 and the package body 110, respectively.

The light emitting structure 123 may comprise a first conductivity type semiconductor layer, a second conductivity type semiconductor layer, and an active layer disposed between the first conductivity type semiconductor layer and the second conductivity type semiconductor layer. The first bonding part 121 may be electrically connected to the first conductivity type semiconductor layer. In addition, the second bonding part 122 may be electrically connected to the second conductivity type semiconductor layer.

The light emitting structure 123 may be provided as a compound semiconductor. The light emitting structure 123 may be formed of, for example, a Group II-VI or Group III-V compound semiconductor. For example, the light emitting structure 123 may comprise at least two elements selected from aluminum (Al), gallium (Ga), indium (In), phosphorus (P), arsenic (As), or nitrogen (Ni).

The light emitting structure 123 may comprise a first conductivity type semiconductor layer, an active layer, and a second conductivity type semiconductor layer.

The first and second conductivity type semiconductor layers may be formed of at least one of Group III-V or Group II-VI compound semiconductors. The first and second conductivity type semiconductor layers may be formed of a semiconductor material having a composition formula of $In_xAl_yGa_{1-x-y}N$ ($0 \leq x \leq 1$, $0 \leq y \leq 1$, $0 \leq x+y \leq 1$). For example, the first and second conductivity type semiconductor layers may comprise at least one selected from a group including GaN, AlN, AlGaN, InGaN, InN, InAlGaN, AlInN, AlGaAs, GaP, GaAs, GaAsP, AlGaInP, and the like. The first conductivity type semiconductor layer may be an n-type semiconductor layer doped with an n-type dopant such as Si, Ge, Sn, Se, Te, and the like. The second conductivity type semiconductor layer may be a p-type semiconductor layer doped with a p-type dopant such as Mg, Zn, Ca, Sr, Ba, and the like.

The active layer may be formed of a compound semiconductor. The active layer may be implemented, for example, in at least one of Group III-V or Group II-VI compound semiconductors. When the active layer is implemented in a multi-well structure, the active layer may comprise a plurality of well layers and a plurality of barrier layers that are alternately arranged, and may comprise a semiconductor material having a composition formula of $In_xAl_yGa_{1-x-y}N$ ($0 \leq x \leq 1$, $0 \leq y \leq 1$, $0 \leq x+y \leq 1$). For example, the active layer may comprise at least one selected from a group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, InP/GaAs, and the like.

The first bonding part 121 and the second bonding part 122 may be spaced apart from each other on the lower surface of the light emitting device 120.

The first bonding part 121 may be disposed on the first frame 111. The second bonding part 122 may be disposed on the second frame 112.

The first and second bonding parts 121 and 122 may be formed as a single layer of multilayer including at least one or an alloy thereof selected from a group including Ti, Al, In, Ir, Ta, Pd, Co, Cr, Mg, Zn, Ni, Si, Ge, Ag, Ag alloy, Au, Hf, Pt, Ru, Rh, Sn, Cu, ZnO, IrOx, RuOx, NiO, RuOx/ITO, Ni/IrOx/Au, Ni/IrOx/Au/ITO.

One of the technical problems of the embodiment is to provide a light emitting device package capable of solving problem of electrical and physical reliability in a bonding region between an electrode of a package body and an electrode of a light emitting device, a method of manufacturing the same, and a light source device including the same.

In order to solve such a problem, in the light emitting device package 100 according to the embodiment, as shown in FIG. 2, an opening is provided in each frame, and a conductive layer is disposed in the opening.

For example, in the embodiment, the first frame 111 may comprise a first opening TH1, and the second frame 112 may comprise a second opening TH2. First and second conductive layers 321 and 322 may be disposed in the first and second openings TH1 and TH2, respectively.

Accordingly, it is possible to provide a light emitting device package having an excellent electrical and physical reliability in a bonding region between an electrode of a package body and an electrode of a light emitting device, a manufacturing method thereof, and a light source device including the same.

For example, according to the light emitting device package and the method of manufacturing the light emitting device of the embodiment, it is possible to prevent the re-melting phenomenon from occurring in the bonding region of the light emitting device package while the light emitting device package is re-bonded to a substrate or the like.

According to the light emitting device package and the method of manufacturing the light emitting device package of the embodiment, the first frame 111 may comprise a first opening TH1 and the second frame 112 may comprise a second opening TH2, and the first and second conductive layers 321 and 322 may be disposed in the first and second openings TH1 and TH2, respectively. The first and second bonding parts 121 and 122 of the light emitting device according to the embodiment may receive driving power through the first and second conductive layers 321 and 322 disposed in the first and second openings TH1 and TH2.

When a conventional light emitting device package is mounted on a sub-mount or a circuit board, a high temperature process such as a reflow may be applied. In this case, in the reflow process, a re-melting phenomenon may occur in the bonding region between the lead frame provided in the light emitting device package and the electrode of the light emitting device. As described above, according to the conventional light emitting device package, the stability of the electrical connection and the physical coupling may be weakened, and the position of the light emitting device may be changed, thereby reducing the optical, electrical characteristics, and reliability of the light emitting device package.

However, in the light emitting device package according to the embodiment, the light emitting device 120 is not only in contact with the first and second frames 111 and 112 of the package body 110, and but also in contact with and bonded to the first and second conductive layers 321 and 322 of the first and second openings TH1 and TH2 of the each frame to prevent the re-melting problem. Further, in the embodiment, the melting point of the conductive layer disposed in the openings may be selected to have a higher value than the melting point of the common bonding material.

In addition, the adhesive material between the light emitting device 120 and the package body 110 and the adhesive material between the light emitting device package and the circuit board may be different from each other to prevent a re-melting problem.

Therefore, even when the light emitting device package 100 according to the embodiment is bonded to the main board and the like through a reflow process, re-melting phenomenon does not occur, so that there is an advantage that electrical connection and physical bonding force are not degraded.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

Also, the embodiment may comprise a first resin part 130 disposed in a recess R of the body 113. The first resin part 130 may be disposed between the light emitting device 120 and the body 113 to increase the bonding force between the body 113 and the light emitting device 120.

Therefore, according to the embodiment, the light emitting device 120 is not only in contact with the first and second frames 111 and 112 of the package body 110, and but also in contact with and bonded to the first and second conductive layers 321 and 322 of the first and second openings TH1 and TH2 of the each frame. In addition, there is a complex technical effect that the first resin part 130 can provide a stable fixing force between the light emitting device 120 and the package body 110.

Referring to FIG. 2, the first opening TH1 may be provided in the first frame 111. The first opening TH1 may be provided through the first frame 111. The first opening TH1 may be provided passing through the upper surface and the lower surface of the first frame 111 in a first direction.

The first opening TH1 may be disposed under the first bonding part 121 of the light emitting device 120. The first opening TH1 may be provided in a manner overlapping with the first bonding part 121 of the light emitting device 120 in a first direction that is toward the lower surface from the upper surface of the first frame 111.

The second opening TH2 may be provided in the second frame 112. The second opening TH2 may be provided through the second frame 112. The second opening TH2 may be provided passing through the upper surface and the lower surface of the second frame 112 in a first direction.

The second opening TH2 may be disposed under the second bonding part 122 of the light emitting device 120. The second opening TH2 may be provided in a manner overlapping with the second bonding part 122 of the light emitting device 120 in a first direction that is toward the lower surface from the upper surface of the second frame 112.

The first opening TH1 and the second opening TH2 may be spaced apart from each other. The first opening TH1 and the second opening TH2 may be spaced apart from each other under the lower surface of the light emitting device 120.

According to the embodiment, the width W1 of the upper portion of the first opening TH1 may be provided less than or equal to the width of the first bonding part 121. In addition, the width of the upper portion of the second opening TH2 may be provided less than or equal to the width of the second bonding part 122.

Therefore, the first bonding part 121 of the light emitting device 120 may not only be in contact with the first conductive layer 321 disposed in the first opening TH1, but also be in contact with the first frame 111, so which can be firmly attached.

Likewise, the second bonding part 122 of the light emitting device 120 may not only be in contact with the second conductive layer 322 disposed in the second opening TH2, but also be in contact with the second frame 112, so which can be firmly attached.

In addition, the width W1 of the upper portion of the first opening TH1 may be provided as several tens of micrometers to several hundreds of micrometers. Also, the width W2 of the lower portion of the first opening TH1 may be provided as several tens of micrometers to several hundreds of micrometers larger than the width W1 of the upper portion of the first opening TH1. As a result, the electrical reliability with the circuit board mounted on the lower portion can be improved, and when the first conductive layer 321 is injected from the lower portion, the conductive layer can be smoothly and uniformly formed, so that the reliability can be improved.

In addition, the width of the upper portion of the second opening TH2 may be provided as several tens of micrometers to several hundreds of micrometers. Also, the width of the lower portion of the second opening TH2 may be provided as several tens of micrometers to several hundreds of micrometers larger than the width of the upper portion of the second opening TH2.

In addition, the width W2 of the lower portion of the first opening TH1 may be provided wider than the width W1 of the upper portion of the first opening TH1. The first opening TH1 may be provided at a predetermined width in the upper portion by a predetermined depth and may be provided in an inclined shape toward the lower portion.

Furthermore, the width of the lower portion of the second opening TH2 may be wider than the width of the upper portion of the second opening TH2. The second opening TH2 may be provided at a predetermined width in the upper portion by a predetermined depth and may be provided in an inclined shape toward the lower portion.

For example, the first opening TH1 may be provided in an inclined shape in which the width gradually decreases from the lower portion to the upper portion. In addition, the second opening TH2 may be provided in an inclined shape in which the width gradually decreases from the lower portion to the upper portion.

In addition, according to the embodiment, both lower portions of the first and second openings TH1 and TH2 may comprise inclined surfaces. However, the present invention is not limited thereto, and the inclined surfaces between the upper portion and the lower portion of the first and second openings TH1 and TH2 may have a plurality of inclined surfaces having different slopes, and the inclined surfaces may be arranged with a curvature.

In addition, the width W3 between the first opening TH1 and the second opening TH2 in the lower surface region of the first frame 111 and the second frame 112 may be provided as several hundreds of micrometers. The width W3 between the first opening TH1 and the second opening TH2 in the lower surface region of the first frame 111 and the second frame 112 may be provided, for example, 100 micrometers to 150 micrometers.

The width W3 between the first opening TH1 and the second opening TH2 in the lower surface region of the first frame 111 and the second frame 112 may be selected to be provided larger than a predetermined distance in order to prevent an electrical short circuit between the pads when the light emitting device package 100 according to the embodiment is later mounted on a circuit board, a sub-mount, or the like.

Referring to FIG. 2, the depth T2 of the first and second openings TH1 and TH2 may be provided corresponding to the thickness of the first and second frames 111 and 112, and the thickness can be provided to maintain a stable strength of the frame.

In addition, the depth 12 of the first and second openings TH1 and TH2 may be provided corresponding to the thickness of the body 113, and the thickness can be provided to maintain a stable strength of the body.

For example, the depth T2 of the first opening TH1 may be provided of several hundred micrometers. The depth T2 of the first opening TH1 may be provided in a range of 180 micrometers to 500 micrometers. For example, the depth T2 of the first opening TH1 may be provided of 500 micrometers.

By way of example, the thickness difference of (T2−T1) may be selected to be at least 100 micrometers or more. This is in consideration of the thickness of the injection process capable of providing crack free of the body 113.

According to the embodiment, the ratio of the T1 thickness to the T2 thickness (T2/T1) may be provided in a range of 2 to 10. As an example, if the thickness of 12 is provided at 200 micrometers, the thickness of T1 may be provided from 20 micrometers to 100 micrometers. When the ratio of the T1 thickness to the T2 thickness (T2/T1) is equal to or greater than 2, the mechanical strength can be secured so that the body 113 is not cracked or disconnected. In addition, the amount of the first resin part 130 disposed in the recess can be sufficiently arranged when the ratio of the T1 thickness to the T2 thickness (T2/T1) is 10 or less, thus the fixing force between the light emitting device 120 and the light emitting device packages 110 can be improved.

Next, in the embodiment, first and second conductive layers 321 and 322 are disposed in the first and second openings TH1 and TH2, respectively, and the first and second openings TH1 and TH2 may be overlapped with the first and second bonding parts 121 and 122 in a vertical direction, respectively.

In addition, the first and second conductive layers 321 and 322 may be overlapped with the first and second bonding parts 121 and 122, respectively, in a vertical direction.

The width of the first and second conductive layers 321 and 322 may be provided smaller than the width of the first and second bonding parts 121 and 122.

The first and second conductive layers 321 and 322 may comprise one material or an alloy thereof selected from a group including Ag, Au, Pt, Sn, Cu, and the like. However, the present invention is not limited thereto, and the first and second conductive layers 321 and 322 may be formed of a material capable of securing a conductive function.

For example, the first and second conductive layers 321 and 322 may be formed using a conductive paste. The conductive paste may comprise a solder paste, a silver paste, or the like, and may be composed of a multi-layer of different materials or an alloy composed of a multi-layer of a single layer. For example, the first conductive layer 321 and the second conductive layer 322 may comprise a SAC (Sn—Ag—Cu) material.

(A Second Resin Part Under/Around a Light Emitting Device)

As shown in FIG. 2, the light emitting device package according to the embodiment may comprise a second resin part 135 under or around the light emitting device 120 to improve an adhesion force between the light emitting device 120 and the first and second frames 111 and 112. In addition, when the second resin part 135 reflects light emitted from the light emitting device 120, the light extraction efficiency of the light emitting device package 100 can be improved.

For example, the first frame 111 may comprise a third upper recess R3 provided on the upper surface thereof, and the second frame 112 may comprise a fourth upper recess R4 provided on the upper surface thereof.

The third upper recess R3 may be recessed from the upper surface of the first frame 111 in a downward direction. The third upper recess R3 may be spaced apart from the first opening TH1 to the outside of the package body 110.

Further, according to the embodiment, the side surface of the third upper recess R3 may have an inclined surface, and may have a curvature. Further, the third upper recess R3 may be formed in a spherical shape, and its side surface may be formed in a circular shape.

The fourth upper recess R4 may be provided on the upper surface of the second frame 112. The fourth upper recess R4 may be recessed in a downward direction from the upper surface of the second frame 112. Further, according to the embodiment, the side surface of the fourth upper recess R4 may have an inclined surface, and may have a curvature. In addition, the fourth upper recess R4 may be formed in a spherical shape, and its side surface may be formed in a circular shape.

In addition, as shown in FIG. 2, the light emitting device package 100 according to the embodiment may comprise a second resin part 135 provided in the third and fourth upper recesses R3 and R4. For example, the second resin part 135 may comprise at least one of an epoxy-based material, a silicone-based material, and a hybrid material including an epoxy-based material and a silicone-based material.

The second resin part 135 may be disposed between the first and second frames 111 and 112 and the light emitting device 120. Accordingly, the second resin part 135 filled in the third upper recess R3 and the fourth upper recess R4 effectively seals around the first and second bonding parts 121 and 122.

In addition, the third upper recess R3 and the fourth upper recess R4 may provide sufficient space under the light emitting device 120 in which the second resin part 135 can be provided. The third upper recess R3 and the fourth upper recess R4 may provide a suitable space in which a kind of under-fill process may be performed under the light emitting device.

Accordingly, the second resin part 135 filled in the third upper recess R3 and the fourth upper recess R4 effectively seal the periphery of the first and second bonding parts 121 and 122.

In addition, in the embodiment, there is a technical effect that after fixing the light emitting device 120 and the package body 110 through the first resin part 130 disposed in the first recess R of the body 113, the second resin part 135 may be disposed in the third and fourth upper recesses R3 and R4 so as to seal the periphery of the first and second bonding parts 121 and 122.

In addition, in the embodiment, when the third and fourth recesses R3 and R4 are disposed to surround a partial region of the first and second bonding parts 121 and 122, it is possible to prevent the first and second conductive layers 121 and 122 from extending to the sides of the light emitting device 120, thereby the electrical short circuit problem in the active layer can be more effectively improved.

In addition, the second resin part 135 may be disposed under the light emitting device 120 to perform a sealing function. In addition, the second resin part 135 can improve an adhesion force between the light emitting device 120 and the first and second frames 111 and 112.

In addition, the second resin part 135 may comprise a material having a reflective property such as $TiO_2$ or white silicone so as to reflect light emitted from the light emitting device 120. Accordingly, the second resin part 135 may reflect the light provided from the light emitting device 120 toward the upper portion of the package body 110 to improve the light extraction efficiency of the light emitting device package 100.

In addition, when the second resin part 135 is arranged to fill the third and fourth upper recesses R3 and R4, as described above, because the third and fourth upper recesses R3 and R4 can be disposed to surround a partial portion of the light emitting device 120, the reflectance in the region where the third and fourth upper recesses R3 and R4 are disposed can be increased. Therefore, the light extraction efficiency of the light emitting device package 100 can be improved.

<Molding Part>

Next, the light emitting device package 100 according to the embodiment may comprise a molding part 140, as shown in FIG. 2.

The molding part 140 may be provided on the light emitting device 120. The molding part 140 may be formed after the second package body 150 is coupled to the first package body 110.

The molding part 140 may be disposed on the first and second frames 111 and 112. The molding part 140 may be disposed in the cavity C provided by the package body 110.

The molding part 140 may comprise an insulating material. The molding part 140 may comprise wavelength conversion means for receiving light emitted from the light emitting device 120 and providing wavelength-converted light. For example, the molding part 140 may comprise at least one selected from a group including phosphors, quantum dots, and the like.

Meanwhile, the light emitting device package described above may be provided with a flip chip light emitting device as an example. For example, the flip chip light emitting device may be provided as a transmissive flip chip light emitting device that emits light in six surface directions, or may be provided as a reflective flip chip light emitting device that emits light in five surface directions.

The reflective flip chip light emitting device that emits light in five surface directions may have a structure in which a reflective layer is disposed in a direction close to the package body 110. For example, the reflective flip chip light emitting device may comprise an insulating reflective layer, such as a Distributed Bragg Reflector, an Omni Directional Reflector, and the like and/or a conductive reflective layer such as Ag, Al, Ni, Au, and the like.

In addition, the flip chip light emitting device that emits light in six surface directions may comprise a first bonding part electrically connected to the first conductivity type semiconductor layer and a second bonding part electrically connected to the second conductivity type semiconductor layer, and may be provided as a general horizontal light emitting device in which light is emitted between the first bonding part and the second bonding part.

In addition, the flip chip light emitting device that emits light in six surface directions may be provided as a transmissive flip chip light emitting device including both a reflective region between the first and second bonding parts in which a reflective layer is disposed and a transmissive region in which light is emitted.

Here, the transmissive flip chip light emitting device means a device that emits light to six surfaces including an upper surface, four side surfaces, and a lower surface. In addition, the reflective flip chip light emitting device means a device that emits light to five surfaces including an upper surface and four side surfaces.

Meanwhile, the light emitting device package 100 according to the embodiment described above may be mounted on a submount, a circuit board, or the like, and supplied.

For example, the light emitting device package 100 of the embodiment may be disposed on a circuit board. The circuit board may comprise a first pad and a second pad, the first pad and the first bonding part 121 may be electrically connected to each other, and the second pad and the second bonding part 122 may be electrically connected to each other.

However, when the conventional light emitting device package is mounted on a sub-mount or a circuit board, a high temperature process such as a reflow may be applied. At this time, in the reflow process, a re-melting phenomenon occurs in the bonding region between the lead frame and the light emitting device provided in the light emitting device package, so that the stability of the electrical connection and the physical coupling may be weakened.

However, according to the light emitting device package and the method of manufacturing the light emitting device package of the embodiment, the first bonding part of the light emitting device according to the embodiment may receive driving power through the conductive layer disposed in the opening. And, the melting point of the conductive layer disposed in the opening may be selected to have a higher value than the melting point of the common bonding material.

Therefore, even when the light emitting device package 100 according to the embodiment is bonded to the main board through a reflow process, re-melting phenomenon does not occur, so that there is an advantage that electrical connection and physical bonding force are not deteriorated.

In addition, according to the light emitting device package 100 and the method of manufacturing the light emitting device package of the embodiment, the package body 110 does not need to be exposed to high temperatures in the process of manufacturing the light emitting device package. Therefore, according to the embodiment, it is possible to prevent the package body 110 from being exposed to high temperatures to be damaged or discolored.

Second Embodiment

FIG. 5 is a cross-sectional view of a light emitting device package 102 according to a second embodiment of the present invention.

The second embodiment can employ the technical features of the first embodiment, and the following description will be focused on the features of the second embodiment.

In the second embodiment, a phosphor layer 160 may be integrally formed on the light emitting device 120. For example, in the light emitting device chip unit, the phosphor layer 160 may be formed by a conformal coating process and diced to form the light emitting device 120 having the phosphor layer 160.

Through this, the second embodiment may maximize the efficiency of the packaging process in a modular form by omitting a separate molding process.

Third Embodiment

FIG. 6a is a cross-sectional view of a light emitting device package 103 according to a third embodiment of the present invention.

The third embodiment can adopt the technical features of the first embodiment and the second embodiment, and the following description will be focused on the main features of the third embodiment.

The third embodiment may comprise a heat dissipation member 132 provided in the first package body 110.

The heat dissipation member 132 may be disposed between the first package body 110 and the light emitting device 120. The heat dissipation member 132 may be disposed between an upper surface of the first package body 110 and a lower surface of the light emitting device 120. The heat dissipation member 132 may be disposed between an upper surface of the body 113 and the lower surface of the light emitting device 120.

The heat dissipation member 132 may be disposed between the first frame 111 and the second frame 112. Also, the lower surface of the body 113 may be disposed on the same plane as the lower surfaces of the first and second frames 111 and 112.

The upper surface of the heat dissipation member 132 may contact the light emitting device 120 and extend in a first direction. The first direction may be defined as a direction from the upper surface of the light emitting device 120 to a lower surface of the body 113.

According to the embodiment, the first distance from the upper surface of the light emitting device 120 to the lower surface of the first frame 111 may be provided equal to or greater than the second distance from the upper surface of the light emitting device 120 to the lower surface of the heat dissipation member 132.

According to the embodiment, the heat dissipation member 132 may be disposed in the third opening TH3. The heat dissipation member 132 may be disposed between the light emitting device 120 and the body 113. The heat dissipation member 132 may be disposed between the first bonding part 121 and the second bonding part 122. For example, the heat dissipation member 132 may be disposed in contact with a side surface of the first bonding part 121 and a side surface of the second bonding part 122.

The first bonding part 121 may comprise a first side surface closer to the second bonding part 112 and a second side surface facing the first side surface. The second bonding part 122 may comprise a third side surface closer to the first bonding part 111 and a fourth side surface facing the third side surface.

According to the embodiment, the heat dissipation member 132 may be in contact with the first side surface of the first bonding part 121 and the third side surface of the second bonding part 122. For example, the heat dissipation member 132 may be disposed in direct contact with the first side surface of the first bonding part 121 and the third side surface of the second bonding part 122.

The heat dissipation member 132 may comprise at least one of an epoxy-based material, a silicone-based material, a hybrid material including an epoxy-based material and a silicone-based material. Also, for example, when the heat dissipation member 132 comprise a reflection function, the heat dissipation member 132 may comprise white silicone. In addition, the heat dissipation member 132 may comprise a material having good thermal conductivity selected from a group including $Al_2O_3$, AlN, and the like.

According to the embodiment, when the heat dissipation member 132 includes a material having a good thermal conductivity, not only the light emitting device 120 can be stably fixed to the package body 110, but also the heat generated from the light emitting device 120 can be effectively released. Accordingly, the light emitting device 120 can be stably fixed to the package body 110, and heat can be effectively emitted, so that light extraction efficiency of the light emitting device 120 can be improved.

In addition, the heat dissipation member 132 may provide a stable fixing force between the body 113 and the light emitting device 120, and when it includes a reflective material, for the light emitted to the lower surface of the light emitting device 120, light diffusing function may be provided between the light emitting device 120 and the body 113. When light is emitted from the light emitting device 120 to the lower surface of the light emitting device 120, the heat dissipation member 132 may improve light extraction efficiency of the light emitting device package 100 by providing a light diffusing function.

According to the embodiment, the heat dissipation member 132 may reflect light emitted from the light emitting device 120. When the heat dissipation member 132 includes a reflection function, the heat dissipation member 132 may be formed of a material including $TiO_2$, silicone, or the like.

The third opening TH3 may provide a suitable space under the light emitting device 120 in which a kind of under-fill process may be performed. The under-fill process may be a process of mounting the light emitting device 120 on the package body 110 and then disposing the heat dissipation member 132 under the light emitting device 120. The third opening TH3 may be provided at a depth greater than a first depth to sufficiently provide the heat dissipation member 132 between the lower surface of the light emitting device 120 and the upper surface of the body 113.

The depth and width W4 of the third opening TH3 may affect the forming position and fixing force of the heat dissipation member 132. The depth and width W4 of the third opening TH3 may be determined so that sufficient fixing force can be provided by the heat dissipation member 132 disposed between the body 113 and the light emitting device 120.

For example, the depth of the third opening TH3 may be provided corresponding to the thickness of the first frame 111 or the second frame 112. The depth of the third opening TH3 may be provided to a thickness capable of maintaining a stable strength of the first frame 111 or the second frame 112.

In addition, the depth of the third opening TH3 may be provided corresponding to the thickness of the body 113. The depth of the third opening TH3 may be provided to a thickness capable of maintaining a stable strength of the body 113.

For example, the depth of the third opening TH3 may be provided as several hundred micrometers. The depth of the third opening TH3 may be provided in a range of 180 micrometers to 220 micrometers. For example, the depth of the third opening TH3 may be provided of 200 micrometers.

In addition, the width W4 of the third opening portion TH3 may be provided several tens of micrometers to several hundreds of micrometers. Here, the width W4 of the third opening TH3 may be provided in the major axis direction of the light emitting device 120.

The width W4 of the third opening TH3 may be narrower than the gap between the first bonding part 121 and the second bonding part 122. The width W4 of the third opening portion TH3 may be provided in a range of 140 micrometers to 400 micrometers.

In addition, according to the embodiment, the sum of the areas of the first and second bonding parts 121 and 122 may be provided 10% or less with reference to the area of the upper surface of the substrate 124. According to the light emitting device package, the sum of the areas of the first and second bonding parts 121 and 122 may be set to be 10% or less with reference to the area of the upper surface of the substrate 124 in order to secure a light emitting area emitted from the light emitting device and increase the light extraction efficiency.

In addition, according to the embodiment, the sum of the areas of the first and second bonding parts 121 and 122 may be provided 0.7% or more with reference to the area of the upper surface of the substrate 124. According to the light emitting device package, the sum of the areas of the first and second bonding parts 121 and 122 may be set to be 0.7% or more with reference to the area of the upper surface of the substrate 124 in order to provide a stable bonding force to the light emitting device to be mounted.

According to another embodiment, the second resin part 135 and the second package body 150 may comprise the same material.

FIG. 6b is a cross-sectional view of a light emitting device package 104 according to a fourth embodiment of the present invention.

The fourth embodiment can employ the technical features of the first to third embodiments, and the following description will focus on the main features of the fourth embodiment.

A recess may not be provided on the upper surface of the body 113 between the first frame 111 and the second frame 112 in the fourth embodiment. For example, the fourth embodiment may not comprise a recess on the region of the body 113 overlapping the light emitting device 120. According to the fourth embodiment, there is a technical effect that the light emitting device 120 is not only in contact with the first and second frames 111 and 112 of the package body 110, but also in contact with and bonded to the first and second conductive layers 321 and 322 in the first and second openings TH1 and TH2 of each frame, and further the first resin part 130 may provide a stable fixing force between the light emitting device 120 and the package body 110.

Hereinafter, an example of a flip chip light emitting device applied to a light emitting device package according to an embodiment will be described.

First, a light emitting device according to an embodiment will be described with reference to FIGS. 7a and 7b.

FIG. 7a is a plan view showing a light emitting device according to an embodiment, and FIG. 7b is a sectional view taken along line A-A of the light emitting device shown in FIG. 7a.

A light emitting device 1100 according to an embodiment may comprise a light emitting structure 1110 disposed on a substrate 1105.

The light emitting device 1100 according to the embodiment may comprise a reflective layer 1160, as shown in FIGS. 7a and 7b. The reflective layer 1160 may comprise a first reflective layer 1161, a second reflective layer 1162, and a third reflective layer 1163.

The second reflective layer 1162 may comprise a first opening h1 exposing the ohmic contact layer 1130. The second reflective layer 1162 may comprise a plurality of first openings h1 disposed on the ohmic contact layer 1130.

The first reflective layer 1161 may comprise a plurality of second openings h2 exposing the upper surface of the first conductive type semiconductor layer 1111.

The light emitting device 1100 according to the embodiment may comprise a first sub electrode 1141 and a second sub electrode 1142, as shown in FIGS. 7a and 7b.

The light emitting device 1100 according to the embodiment may comprise a protective layer 1150, as shown in FIGS. 7a and 7b.

The protective layer 1150 may comprise a plurality of third openings h3 exposing the second sub electrode 1142. The plurality of third openings h3 may be disposed corresponding to a plurality of PB regions provided in the second sub electrode 1142.

In addition, the protective layer 1150 may comprise a plurality of fourth openings h4 exposing the first sub electrode 1141. The plurality of fourth openings h4 may be disposed corresponding to a plurality of NB regions provided in the first sub electrode 1141.

The light emitting device 1100 according to the embodiment may comprise a first bonding part 1171 and a second bonding part 1172 disposed on the protective layer 1150 as shown in FIGS. 7a and 7b.

Meanwhile, according to the light emitting device of the embodiment, when viewed from the upper direction of the light emitting device 1100, the sum of the areas of the first bonding part 1171 and the second bonding part 1172 may be provided equal to or smaller than 60% of the total area of the upper surface of the light emitting device 1100 in which the first bonding part 1171 and the second bonding part 1172 are disposed.

For example, the total area of the upper surface of the light emitting device 1100 may correspond to an area defined by a lateral length and a longitudinal length of the lower surface of the first conductive semiconductor layer 1111 of the light emitting structure 1110. In addition, the total area of the upper surface of the light emitting device 1100 may correspond to the area of the upper surface or the lower surface of the substrate 1105.

By thus providing the sum of the areas of the first bonding part 1171 and the second bonding part 1172 equal to or smaller than 60% of the total area of the light emitting device 1100, the amount of light emitted to the surface where the first bonding part 1171 and the second bonding part 1172 are disposed can be increased. Accordingly, according to the embodiment, since the amount of light emitted toward the six surfaces of the light emitting device 1100 is increased, the light extraction efficiency can be improved and the light intensity Po can be increased.

In addition, when viewed from the upper direction of the light emitting device 1100, the sum of the area of the first bonding part 1171 and the area of the second bonding part 1172 may be provided equal to or greater than 30% of the total area of the light emitting device 1100.

As such, by thus providing the sum of the areas of the first bonding part 1171 and the second bonding part 1172 is provided equal to or greater than 30% of the total area of the light emitting device 1100, stable mounting can be performed through the first bonding part 1171 and the second bonding part 1172, and the electrical characteristics of the light emitting device 1100 can be secured.

In the light emitting device 1100 according to the embodiment, the sum of the area of the first bonding part 1171 and the second bonding part 1172 may be selected to be 30% or more and 60% or less of the total area of the light emitting device 1100 in consideration of light extraction efficiency and securing bonding stability.

That is, when the sum of the areas of the first bonding part 1171 and the second bonding part 1172 is 30% or more and 100% or less of the total area of the light emitting device 1100, the electrical characteristics of the light emitting device 1100 can be ensured and the bonding force to be mounted on the light emitting device package can be ensured, so that stable mounting can be performed.

In addition, when the sum of the areas of the first bonding part 1171 and the second bonding part 1172 is greater than 0% and equal to or less than 60% of the total area of the light emitting device 1100, the amount of light emitted to the surface on which the first bonding part 1171 and the second bonding part 1172 is disposed may increase, thereby light extraction efficiency of the light emitting device 1100 can be improved and the light intensity Po can be increased.

In the embodiment, the sum of the areas of the first bonding part 1171 and the second bonding part 1172 is selected to be 30% or more and 60% or less of the total area of the light emitting device 1100 in order to secure electrical characteristics of the light emitting device 1100 and bonding force to be mounted on the light emitting device package and increase brightness.

In addition, according to the light emitting device 1100 of the embodiment, the third reflective layer 1163 may be disposed between the first bonding part 1171 and the second bonding part 1172. For example, the length W5 of the third reflective layer 1163 along the major axis direction of the light emitting device 1100 may correspond to the distance between the first bonding part 1171 and the second bonding part 1172. In addition, the area of the third reflective layer 1163 may be, for example, 10% or more and 25% or less of the entire upper surface of the light emitting device 1100.

When the area of the third reflective layer 1163 is 10% or more of the entire upper surface of the light emitting device 1100, the package body disposed under the light emitting device can be prevented from cracking or discolored, and when it is 25% or less, it is advantageous to secure the light extraction efficiency to emit light to the six surfaces of the light emitting device.

In addition, in other embodiments it can be not limited thereto, the area of the third reflective layer 1163 may be disposed to be greater than 0% and less than 10% of the entire upper surface of the light emitting device 1100 in order to secure a larger light extraction efficiency. In addition, in order to prevent discoloration or cracking in the package body, the area of the third reflective layer 1163 may be disposed more than 25% to less than 100% of the entire upper surface of the light emitting device 1100.

In addition, light generated in the light emitting structure 1110 may be transmitted through and emitted to a second region provided between the side surface disposed in the long axis direction of the light emitting device 1100 and the adjacent first bonding part 1171 or the second bonding part 1172.

In addition, light generated in the light emitting structure may be transmitted through and emitted to a third region provided between the side surface disposed in the short axis direction of the light emitting device 1100 and the adjacent first bonding part 1171 or the second bonding part 1172.

According to the embodiment, the size of the first reflective layer 1161 may be provided several micrometers larger than the size of the first bonding part 1171. For example, the area of the first reflective layer 1161 may be provided sufficiently large to cover the area of the first bonding part 1171. The length of one side of the first reflective layer 1161 may be provided about 4 micrometers to 10 micrometers larger than the length of one side of the first bonding part 1171 in consideration of a process error.

In addition, the size of the second reflective layer 1162 may be provided several micrometers larger than the size of the second bonding part 1172. For example, the area of the second reflective layer 1162 may be provided sufficiently large to cover the area of the second bonding part 1172. The length of one side of the second reflective layer 1162 may be provided about 4 micrometers to 10 micrometers larger than the length of one side of the first bonding part 1171 in consideration of a process error.

According to the embodiments, light emitted from the light emitting structure 1110 may be reflected by the first reflective layer 1161 and the second reflective layer 1162 without being incident on the first bonding part 1171 and the second bonding part 1172. Accordingly, according to the embodiment, it is possible to minimize the light generated and emitted from the light emitting structure 1110 incident to the first bonding part 1171 and the second bonding part 1172 to be lost.

In addition, according to the light emitting device 1100 of the embodiment, since the third reflective layer 1163 is disposed between the first bonding part 1171 and the second bonding part 1172, the amount of light emitted through a region between the first bonding part 1171 and the second bonding part 1172 can be adjusted.

As described above, the light emitting device 1100 according to the embodiment may be mounted, for example, in a flip chip bonding manner to provide a light emitting device package. In this case, when the package body in which the light emitting device 1100 is mounted is provided with a resin or the like, in a region under light emitting device 1100, the package body may be discolored or cracked due to the short wavelength strong light emitted from the light emitting device 1100.

However, according to the light emitting device 1100 of the embodiment, since the amount of light emitted between the regions where the first bonding part 1171 and the second bonding part 1172 are disposed can be adjusted, so that it is possible to prevent the package body disposed in a region under the light emitting device 1100 from being discolored or cracked.

According to the embodiment, light generated in the light emitting structure 1110 may be transmitted through and emitted in an area of 20% or more of an upper surface of the light emitting device 1100 on which the first bonding part 1171, the second bonding part 1172, and the third reflective layer 1163 are disposed.

Accordingly, according to the embodiment, since the amount of light emitted toward the six surfaces of the light emitting device 1100 is increased, the light extraction efficiency can be improved and the light intensity Po can be increased. In addition, it is possible to prevent the package body disposed close to the lower surface of the light emitting device 1100 from being discolored or cracked.

In addition, according to the light emitting device 1100, the ohmic contact layer 1130 may be provided with a plurality of contact holes C1, C2, and C3. The second conductivity type semiconductor layer 1113 and the reflective layer 1160 may be bonded to each other through the plurality of contact holes C1, C2, and C3 provided in the ohmic contact layer 1130. The reflective layer 1160 can be in direct contact with the second conductivity type semiconductor layer 1113 so that the adhesive force can be improved as compared with the case where the reflective layer 1160 is in contact with the ohmic contact layer 1130.

When the reflective layer 1160 is directly in contact with the ohmic contact layer 1130, the bonding force or adhesion between the reflective layer 1160 and the ohmic contact layer 1130 may be weakened. For example, when the insulating layer and the metal layer are combined, the bonding force or adhesion between the materials may be weakened.

For example, if the bonding force or adhesive force between the reflective layer 1160 and the ohmic contact layer 1130 is weak, peeling may occur between the two layers. If the peeling occurs between the reflective layer 1160 and the ohmic contact layer 1130, the characteristics of the light emitting device 1100 may deteriorate and the reliability of the light emitting device 1100 cannot be secured.

However, according to the embodiment, since the reflective layer 1160 can directly contact the second conductivity type semiconductor layer 1113, the bonding force and the adhesive force between the reflective layer 1160, the ohmic contact layer 1130, and the second conductivity type semiconductor layer 1113 can be stably provided.

Therefore, according to the embodiment, since the bonding force between the reflective layer 1160 and the second conductivity type semiconductor layer 1113 can be stably provided, the reflective layer 1160 can be prevented from being peeled from the ohmic contact layer 1130. In addition, since the bonding force between the reflective layer 1160 and the second conductivity type semiconductor layer 1113 can be stably provided, reliability of the light emitting device 1100 can be improved.

Meanwhile, as described above, the ohmic contact layer 1130 may be provided with a plurality of contact holes C1, C2, and C3. The light emitted from the active layer 1112 may be incident on the reflective layer 1160 through the plurality of contact holes C1, C2, and C3 provided in the ohmic contact layer 1130 and may be reflected. Accordingly, it is possible to reduce the loss of light that is emitted from the active layer 1112 incident to the ohmic contact layer, and the light extraction efficiency can be improved. Accordingly, according to the light emitting device 1100 of the embodiment, the brightness can be improved.

Next, another example of the flip chip light emitting device applied to the light emitting device package according to the embodiment will be described with reference to the accompanying drawings.

First, a light emitting device according to an embodiment will be described with reference to FIGS. 8a and 8b. FIG. 8a is a plan view showing an electrode arrangement of the light emitting device applied to the light emitting device package according to the embodiment, and FIG. 8b is a cross-sectional view taken along line F-F of the light emitting device shown in FIG. 8a.

Meanwhile, in FIG. 8a, to make understanding easier, only the relative arrangement of the first electrode 127 and the second electrode 128 is conceptually shown. The first electrode 127 may comprise a first bonding part 121 and a first branch electrode 125. The second electrode 128 may comprise a second bonding part 122 and a second branch electrode 126.

Unlike the flip chip light emitting device of FIG. 8a, a ratio between the area of the first and second bonding parts 121 and 122 of the first light emitting device 120A and the area of the light emitting structure 123 of the first light emitting device 120A may be different. The light emitting device according to the embodiment may comprise a light emitting structure 123 disposed on the substrate 124, as shown in FIGS. 8a and 8b.

The substrate 124 may be selected from a group including a sapphire substrate (Al$_2$O$_3$), SiC, GaAs, GaN, ZnO, Si, GaP, InP and Ge. For example, the substrate 124 may be provided as a patterned sapphire substrate (PSS) having a concavo-convex pattern formed on its upper surface.

The light emitting structure 123 may comprise a first conductivity type semiconductor layer 123a, an active layer 123b, and a second conductivity type semiconductor layer 123c. The active layer 123b may be disposed between the first conductivity type semiconductor layer 123a and the second conductivity type semiconductor layer 123c. For example, the active layer 123b may be disposed on the first conductivity type semiconductor layer 123a, and the second conductivity type semiconductor layer 123c may be disposed on the active layer 123b.

According to the embodiment, the first conductivity type semiconductor layer 123a may be provided as an n-type semiconductor layer and the second conductivity type semiconductor layer 123c may be provided as a p-type semiconductor layer. Of course, according to another embodiment, the first conductivity type semiconductor layer 123a may be provided as a p-type semiconductor layer, and the second conductivity type semiconductor layer 123c may be provided as an n-type semiconductor layer.

The light emitting device according to the embodiment may comprise a first electrode 127 and a second electrode 128, as shown in FIGS. 8a and 8b.

The first electrode 127 may comprise a first bonding part 121 and a first branch electrode 125. The first electrode 127 may be electrically connected to the second conductivity type semiconductor layer 123c. The first branch electrodes 125 may be branched from the first bonding part 121. The first branch electrode 125 may comprise a plurality of branch electrodes branched from the first bonding part 121.

The second electrode 128 may comprise a second bonding part 122 and a second branch electrode 126. The second electrode 128 may be electrically connected to the first conductivity type semiconductor layer 123a. The second branch electrode 126 may be branched from the second bonding part 122. The second branch electrode 126 may comprise a plurality of branch electrodes branched from the second bonding part 122.

The first branch electrode 125 and the second branch electrode 126 may be arranged to be offset from each other in a finger shape. The power supplied through the first bonding part 121 and the second bonding part 122 by the first branch electrode 125 and the second branch electrode 126 can be diffused and provided to the entire light emitting structure 123.

The first electrode 127 and the second electrode 128 may have a single-layer structure or a multi-layer structure. For example, the first electrode 127 and the second electrode 128 may be ohmic electrodes. For example, the first electrode 127 and the second electrode 128 may be formed of at least one or an alloy of two or more of ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au and Hf.

Meanwhile, a protective layer may be further provided to the light emitting structure 123. The protective layer may be provided on the upper surface of the light emitting structure 123. Further, the protective layer may be provided on a side surface of the light emitting structure 123. The protective layer may be provided so that the first bonding part 121 and the second bonding part 122 can be exposed. In addition, the protective layer may be selectively provided on the periphery and the lower surface of the substrate 124.

By way of example, the protective layer may be provided as an insulating material. For example, the protective layer may be formed of at least one material selected from a group including SixOy, SiOxNy, SixNy, and AlxOy.

In the light emitting device according to the embodiment, light generated in the active layer 123*b* may be emitted in six surface directions of the light emitting device. Light generated in the active layer 123*b* may be emitted in six surface directions through the upper surface, the lower surface, and four side surfaces of the light emitting device.

Meanwhile, the light emitting device package according to the embodiment described above is based on the case where the first and second bonding parts 121 and 122 are in direct contact with the first and second conductive layers 321 and 322.

However, according to another embodiment of the light emitting device package of the embodiment, a separate conductive element may be further disposed between the first and second bonding parts 121 and 122 and the first and second conductive layers 321 and 322.

Meanwhile, the light emitting device package according to the described embodiment can be applied to the light source device.

Further, the light source device may comprise a display device, a lighting device, a head lamp, and the like depending on an industrial field.

As an example of the light source device, a display device may comprise a bottom cover, a reflector disposed on the bottom cover, a light emitting module including a light emitting device that emits light, a light guide plate disposed in front of the reflector and guiding light emitted from the light emitting module forward, an optical sheet including prism sheets disposed in front of the light guide plate, a display panel disposed in front of the optical sheet, an image signal output circuit connected to the display panel to supply an image signal to the display panel, and a color filter disposed in front of the display panel. In this case, the bottom cover, the reflector, the light emitting module, the light guide plate, and the optical sheet may constitute a backlight unit. In addition, the display device may not include a color filter, and may have a structure in which the light emitting device emitting red, green, and blue light are disposed, respectively.

As another example of the light source device, the head lamp may include a light emitting module including a light emitting device package disposed on a substrate, a reflector for reflecting light emitted from the light emitting module in a predetermined direction, for example, forward, a lens for refracting light reflected by the reflector forward, and a shade for constructing a light distribution pattern desired by designer by blocking or reflecting a portion of the light that is reflected by the reflector to be directed to the lens.

As another example of the light source device, the lighting device may include a cover, a light source module, a heat radiator, a power supply, an inner case, and a socket. In addition, the light source device according to an embodiment may further include at least one of a member and a holder. The light source module may include the light emitting device or the light emitting device package according to the embodiment.

Meanwhile, the light emitting device package according to the embodiment described above may comprise various modifications.

Hereinafter, modifications of the light emitting device package according to the embodiment will be described with reference to the drawings, and each modification may be applied to the embodiments of the light emitting device package described above. In addition, each of the modifications described below can be applied in combination with a plurality of modified examples within a range where they do not collide with each other.

First, referring to FIG. 9, another example of the light emitting device package according to the embodiment will be described. FIG. 9 is a view showing another example of the light emitting device package according to the embodiment.

In the description of the light emitting device package according to the embodiment referring to FIG. 9, description overlapping with those described above may be omitted.

The upper surface of the first package body 110 may be provided as a flat surface, as compared with the embodiment described with reference to FIGS. 1 to 4*d*, in the light emitting device package according to the embodiment. The light emitting device package according to the embodiment may not comprise a cavity.

In addition, the light emitting device package according to the embodiment may not comprise a recess provided in the first package body 110 as compared with the embodiments described with reference to FIGS. 1 to 4*d*. According to the embodiment, as shown in FIG. 9, a recess may not be provided on the upper surface of the first package body 110.

For example, the first package body 110 may comprise a first frame 111, a second frame 112, and a body 113. The upper surface of the first frame 111 may be provided with a recess-less structure. Further, the upper surface of the second frame 112 may be provided with a recess-less structure. Also, the upper surface of the body 113 may be provided with a recess-less structure.

The upper surface of the body 113 disposed between the first opening TH1 and the second opening TH2 may be provided as a flat surface. The upper surface of the body 113 and the lower surface of the light emitting device 120 may be disposed parallel to each other. The first resin part 130 may be provided between the upper surface of the body 113 and the light emitting device 120.

The body 113 and the light emitting device 120 may be stably fixed by the first resin part 130 disposed between the first and second bonding parts 121 and 122 in a region under the light emitting device 120. The first resin part 130 may be provided to be diffused between the lower surface of the light emitting device 120 and the upper surface of the body 113. The second resin part 135 may be provided on side surfaces of the first and second bonding parts 121 and 1221. The second resin part 135 may be disposed around the first and second bonding parts 121 and 122.

In addition, as shown in FIG. 9, a molding part 140 may be disposed around the light emitting device 120. A portion of the lower surface of the molding part 140 may directly contact the upper surface of the body 113. In addition, a portion of the lower surface of the molding part 140 may directly contact the upper surfaces of the first and second frames 111 and 112. Since the lower surface of the molding part 140 is in direct contact with the upper surface of the first and second frames 111 and 112, and the upper surface of the body 113, the attachment force between the molding part 140 and the first package body 110 can be improved.

The side surface of the molding part 140 and the side surface of the first package body 110 may be disposed on the same vertical plane. The side surface of the molding part 140 and the side surface of the first package body 110 may provide the same plane.

Next, referring to FIG. 10, another example of the light emitting device package according to the embodiment will be described. FIG. 10 is a view showing another example of the light emitting device package according to the embodiment.

In the description of the light emitting device package according to the embodiment referring to FIG. 10, descriptions overlapping with those described above may be omitted.

The upper surface of the first package body 110 may be provided as a flat surface in the light emitting device package according to the embodiment, as compared with the embodiment described with reference to FIG. 5. The light emitting device package according to the embodiment may not comprise a cavity.

In addition, the light emitting device package according to the embodiment may not comprise a recess provided in the first package body 110 as compared with the embodiment described with reference to FIG. 5. According to the embodiment, as shown in FIG. 10, a recess may not be provided on the upper surface of the first package body 110.

For example, the first package body 110 may comprise a first frame 111, a second frame 112, and a body 113. The upper surface of the first frame 111 may be provided with a recess-less structure. Further, the upper surface of the second frame 112 may be provided with a recess-less structure. Also, the upper surface of the body 113 may be provided with a recess-less structure.

The upper surface of the body 113 disposed between the first opening TH1 and the second opening TH2 may be provided as a flat surface. The upper surface of the body 113 and the lower surface of the light emitting device 120 may be disposed parallel to each other. The first resin part 130 may be provided between the upper surface of the body 113 and the light emitting device 120.

The body 113 and the light emitting device 120 may be stably fixed by the first resin part 130 disposed between the first and second bonding parts 121 and 122 in a region under the light emitting device 120. The first resin part 130 may be provided to be diffused between the lower surface of the light emitting device 120 and the upper surface of the body 113. The second resin part 135 may be provided on side surfaces of the first and second bonding parts 121 and 1221. The second resin part 135 may be disposed around the first and second bonding parts 121 and 122.

In addition, as shown in FIG. 10, a molding part 140 may be disposed around the light emitting device 120. A portion of the lower surface of the molding part 140 may directly contact the upper surface of the body 113. In addition, a portion of the lower surface of the molding part 140 may directly contact the upper surfaces of the first and second frames 111 and 112. Since the lower surface of the molding part 140 is in direct contact with the upper surface of the first and second frames 111 and 112 and the upper surface of the body 113, the attachment force between the molding part 140 and the first package body 110 can be improved.

The side surface of the molding part 140 and the side surface of the first package body 110 may be disposed on the same vertical plane. The side surface of the molding part 140 and the side surface of the first package body 110 may provide the same plane.

In addition, according to the light emitting device package of the embodiment, a phosphor layer 160 may be integrally formed on the light emitting device 120. For example, the phosphor layer 160 may be formed by conformal coating process in a unit of a light emitting device chip and may be diced to provide a light emitting device 120 having a phosphor layer 160.

For example, the molding part 140 and the phosphor layer 160 may comprise light-conversion materials having different wavelength bands.

Next, referring to FIG. 11, another example of the light emitting device package according to the embodiment will be described. FIG. 11 is a view showing another example of the light emitting device package according to the embodiment.

In the description of the light emitting device package according to the embodiment referring to FIG. 11, descriptions overlapping with those described above may be omitted.

The upper surface of the first package body 110 may be provided as a flat surface in the light emitting device package according to the embodiment, as compared with the embodiment described with reference to FIG. 6. The light emitting device package according to the embodiment may not comprise a cavity.

In addition, the light emitting device package according to the embodiment may not comprise a recess provided in the first package body 110 as compared with the embodiment described with reference to FIG. 6. According to the embodiment, as shown in FIG. 11, a recess may not be provided on the upper surface of the first package body 110. Further, the body 113 may not be provided with an opening.

For example, the first package body 110 may comprise a first frame 111, a second frame 112, and a body 113. The upper surface of the first frame 111 may be provided with a recess-less structure. Further, the upper surface of the second frame 112 may be provided with a recess-less structure. Also, the upper surface of the body 113 may be provided with a recess-less structure.

The upper surface of the body 113 disposed between the first opening TH1 and the second opening TH2 may be provided as a flat surface. The upper surface of the body 113 and the lower surface of the light emitting device 120 may be disposed parallel to each other. The first resin part 130 may be provided between the upper surface of the body 113 and the light emitting device 120.

The body 113 and the light emitting device 120 may be stably fixed by the first resin part 130 disposed between the first and second bonding parts 121 and 122 in a region under the light emitting device 120. The first resin part 130 may be provided to be diffused between the lower surface of the light emitting device 120 and the upper surface of the body 113. The second resin part 135 may be provided on side surfaces of the first and second bonding parts 121 and 1221. The second resin part 135 may be disposed around the first and second bonding parts 121 and 122.

In addition, as shown in FIG. 11, a molding part 140 may be disposed around the light emitting device 120. A portion of the lower surface of the molding part 140 may directly contact the upper surface of the body 113. In addition, a portion of the lower surface of the molding part 140 may directly contact the upper surfaces of the first and second frames 111 and 112. Since the lower surface of the molding part 140 is in direct contact with the upper surface of the first and second frames 111 and 112 and the upper surface of the body 113, the attachment force between the molding part 140 and the first package body 110 can be improved.

The side surface of the molding part 140 and the side surface of the first package body 110 may be disposed on the same vertical plane. The side surface of the molding part 140 and the side surface of the first package body 110 may provide the same plane.

Meanwhile, the second resin part 135 may be disposed on a side surface of the light emitting device 120. This is because the second resin part 135 can ride on the side surface of the light emitting device 120 due to OH provided on the surface of the light emitting device 120. At this time, if the thickness of the second resin part 135 provided on the side surface of the light emitting device 120 is too thick, the light intensity Po may be lowered, so that control of an appropriate thickness is required. Since the second resin part 135 can be disposed on the side surface of the light emitting device 120, a double protective film structure can be provided, and there is an advantage that moisture resistance can be improved, and the light emitting device 120 can be protected from other contaminants.

Next, referring to FIG. 12, another example of the light emitting device package according to the embodiment will be described. FIG. 12 is a view showing another example of the light emitting device package according to the embodiment.

In the description of the light emitting device package according to the embodiment referring to FIG. 12, descriptions overlapping with those described above may be omitted.

In the light emitting device package according to the embodiment, the upper surface of the first package body 110 may be provided as a flat surface. The light emitting device package according to the embodiment may not comprise a cavity.

In addition, the light emitting device package according to the embodiment may not comprise a recess provided in the first package body 110. According to the embodiment, a recess may not be provided on the upper surface of the first package body 110.

For example, the first package body 110 may comprise a first frame 111, a second frame 112, and a body 113. The upper surface of the first frame 111 may be provided with a recess-less structure. Further, the upper surface of the second frame 112 may be provided with a recess-less structure. Also, the upper surface of the body 113 may be provided with a recess-less structure.

The light emitting device package according to the embodiment may comprise a first resin 130, a second resin 131, and a third resin 132 disposed between the light emitting device 120 and the first package body 110. The first to third resins 131, 131, and 132 may comprise an adhesive function, a reflective function, and the like. At least one resin among the first to third resins 130, 131, and 132 may comprise a different material from the other resin.

In addition, a molding part 140 may be disposed around the light emitting device 120. A portion of the lower surface of the molding part 140 may directly contact the upper surface of the first package body 110. In addition, a portion of the lower surface of the molding part 140 may directly contact the upper surfaces of the first and second frames 111 and 112. The adhesion between the molding part 140 and the first package body 110 can be improved as the lower surface of the molding part 140 directly contacts the upper surfaces of the first and second frames 111 and 112.

Also, the upper surface of the molding part 140 may be provided as a curved surface. For example, the upper surface of the molding part 140 may be provided as a spherical surface, or may be provided as an aspherical surface. As the upper surface of the molding part 140 is provided as a curved surface, the view angle of light extracted from the light emitted from the light emitting device 120 through the molding part 140 can be adjusted.

The molding part 140 may be disposed on a portion of the upper surface of the first package body 110 or on the entire upper surface of the first package body 110.

In addition, the first and second openings TH1 and TH2 of the first package body 110 may be provided with the first and second conductive layers 321 and 322 filled therein. According to another embodiment, the first and second openings TH1 and TH2 of the first package body 110 are provided in a state in which the first and second conductive layers 321 and 322 are not filled.

Meanwhile, as described with reference to FIG. 11, the second and third resins 131 and 132 may be disposed on the side of the light emitting device 120. This is because the second and third resins 131 and 132 can ride on the side surface of the light emitting device 120 due to the OH⁻ provided on the surface of the light emitting device 120. At this time, if the thickness of the first and second resins 131 and 132 provided on the side surface of the light emitting device 120 is too thick, the light intensity Po may be lowered, so that control of an appropriate thickness is required. Also, since the first and second resins 131 and 132 can be disposed on the side surface of the light emitting device 120, a double protective film structure can be provided, and there is an advantage that moisture resistance can be improved, and the light emitting device 120 can be protected from other contaminants.

Next, referring to FIG. 13, another example of the light emitting device package according to the embodiment will be described. FIG. 13 is a view showing another example of the light emitting device package according to the embodiment.

In the description of the light emitting device package according to the embodiment referring to FIG. 13, descriptions overlapping with those described above may be omitted.

The light emitting device package according to the embodiment described above may comprise a first package body 110 provided with a first opening TH1 and a second opening TH2 as shown in FIG. 13. The upper surface of the first package body 110 may be provided flat, for example, over the entire area. The first and second openings TH1 and TH2 may be provided passing through the first package body 110 in a first direction from the upper surface to the lower surface.

For example, the first opening TH1 may be provided so as to pass through the lower surface of the first frame 111 from the upper surface thereof. In addition, the second opening TH2 may be provided so as to pass through the lower surface of the second frame 112 from the upper surface thereof.

The first and second openings TH1 and TH2 may be provided in a rectangular shape on the upper surface of the first package body 110, for example. In addition, the first and second openings TH1 and TH2 may be provided in a rectangular shape on the lower surface of the first package body 110.

In addition, according to another embodiment, the first and second openings TH1 and TH2 may be provided in a circular shape on the upper surface and the lower surface of the first package body 110, respectively. Further, the first opening portion TH1 may be provided as a plurality of openings, and the second opening TH2 may be provided as a plurality of openings.

Next, referring to FIG. 14, another example of the light emitting device package according to the embodiment will be described. FIG. 14 is a view showing another example of the light emitting device package according to the embodiment.

In the description of the light emitting device package according to the embodiment referring to FIG. 14, descriptions overlapping with those described above may be omitted.

The light emitting device package according to the embodiment may comprise a molding part 140 disposed on the first package body 110 as shown in FIG. 14. The first package body 110 may comprise first and second openings TH1 and TH2 passing through from the upper surface to the lower surface thereof.

For example, the first opening TH1 may be provided in the first frame 111. Also, the second opening portion TH2 may be provided in the second frame 112.

In addition, the light emitting device package according to the embodiment may comprise a light emitting device 120 comprising a first bonding part 121 and a second bonding part 122. The first and second bonding parts 121 and 122 may be disposed on the first and second openings TH1 and TH2, respectively.

The molding part 140 may be disposed around the light emitting device 120. The molding part 140 may be disposed under the light emitting device 120. The molding part 140 may be disposed between the first and second bonding parts 121 and 122. The molding unit 140 can stably fix the lower surface of the light emitting device 120 and the upper surface of the first package body 110. The first and second bonding parts 121 and 122 may be sealed by the molding part 140. The upper portion of the first and second openings TH1 and TH2 may be sealed by the molding part 140.

The molding part 140 may be disposed around the light emitting device 120 and may be disposed such that an outer area of the upper surface of the first package body 110 is exposed. The width of the lower surface of the molding part 140 may be provided smaller than the width of the upper surface of the first package body 110.

According to the embodiment, the first and second conductive layers 321 and 322 may be filled in the first and second openings TH1 and TH2.

In addition, according to another embodiment, it is possible to be provided in a state that the first and second conductive layers 321 and 322 may not be filled in the first and second openings TH1 and TH2, and the conductive layers may be filled in the first and second openings TH1 and TH2 while the first package body 110 is mounted on a circuit board or the like.

Meanwhile, according to the embodiment, another resin may be further provided between the light emitting device 120 and the body 110. The resin may comprise at least one of the materials selected from a group including the first resin part 130, the second resin part 135, the molding part 140, and the adhesive described above. The resin may comprise an adhesive function, a reflective function, and the like.

Next, referring to FIG. 15, another example of the light emitting device package according to the embodiment will be described. FIG. 15 is a view showing still another example of the light emitting device package according to the embodiment.

In describing a light emitting device package according to an embodiment referring to FIG. 15, descriptions overlapping with those described above may be omitted.

The light emitting device package according to the embodiment may comprise a molding part 140 disposed on the first package body 110, as shown in FIG. 15. The first package body 110 may comprise first and second openings TH1 and TH2 passing through from the upper surface to the lower surface thereof.

For example, the first opening TH1 may be provided in the first frame 111. Also, the second opening TH2 may be provided in the second frame 112.

In addition, the light emitting device package according to the embodiment may comprise the light emitting device 120 comprising the first bonding part 121 and the second bonding part 122. The first and second bonding parts 121 and 122 may be disposed on the first and second openings TH1 and TH2, respectively.

The molding part 140 may be disposed around the light emitting device 120. The molding part 140 may be disposed under the light emitting device 120. The molding part 140 may be disposed between the first and second bonding parts 121 and 122. The molding unit 140 can stably fix the lower surface of the light emitting device 120 and the upper surface of the first package body 110. The first and second bonding parts 121 and 122 may be sealed by the molding part 140. The upper portion of the first and second openings TH1 and TH2 may be sealed by the molding part 140.

The molding part 140 may be disposed around the light emitting device 120 and may be disposed on a side surface of the first package body 110. The width of the lower surface of the molding part 140 may be provided larger than the width of the upper surface of the first package body 110.

Meanwhile, according to the embodiment, another resin may be further provided between the light emitting device 120 and the body 110. The resin may comprise at least one of the materials selected from a group including the first resin part 130, the second resin part 135, the molding part 140, and the adhesive described above. The resin may comprise an adhesive function, a reflective function, and the like.

Further, according to the embodiment, the vertical cross section of the first and second openings TH1 and TH2 may be provided in an asymmetrical polygonal shape.

For example, the vertical cross section of the first and second openings TH1 and TH2 may be provided in an asymmetrical rectangular shape. The vertical cross section of the first and second openings TH1 and TH2 may be provided in an asymmetrical trapezoidal shape. For example, the inclination angle of the inclined surfaces facing each other of the first and second openings TH1 and TH2 with respect to the bottom surface of the body 110 may be provided larger than the inclination angle of the inclined surface disposed outside with respect to the bottom surface of the body 110.

Since the shapes of the first and second openings TH1 and TH2 are provided as described above, the first and second conductive layers 321 and 322 can be easily formed in the first and second openings TH1 and TH2.

Next, referring to FIG. 16, another example of the light emitting device package according to the embodiment will be described. FIG. 16 is a view showing another example of the light emitting device package according to the embodiment.

In describing a light emitting device package according to an embodiment, descriptions overlapping with those described above may be omitted.

The light emitting device package according to the embodiment may comprise a molding part 140 disposed on the first package body 110 as shown in FIG. 16. The first package body 110 may comprise first and second openings TH1 and TH2 passing through from the upper surface to the lower surface thereof.

For example, the first opening TH1 may be provided in the first frame 111. Also, the second opening TH2 may be provided in the second frame 112.

In addition, the light emitting device package according to the embodiment may comprise the light emitting device 120 comprising the first bonding part 121 and the second bonding part 122. The first and second bonding parts 121 and 122 may be disposed on the first and second openings TH1 and TH2, respectively.

A first resin part 2130 and a second resin part 2135 may be provided between the light emitting device 120 and the first package body 110. The first resin part 2130 may be disposed between the first bonding part 121 and the second bonding part 122. The first resin part 2130 may be diffused and disposed under the lower surface of the light emitting device 120. The second resin part 2135 may be disposed on the side surfaces of the first and second bonding parts 121 and 122. The second resin part 2135 may be disposed around the first and second bonding parts 121 and 122.

The light emitting device 120 and the first package body 110 can be stably fixed by the first resin part 2130 and the second resin part 2135. The peripheries of the first and second bonding parts 121 and 122 may be sealed by the first resin part 2130 and the second resin part 2135. Also, the first and second openings TH1 and TH2 may be sealed by the first resin part 2130 and the second resin part 2135.

The first resin part 2130 and the second resin part 2135 may comprise different materials each other. The first resin part 2130 and the second resin part 2135 may comprise an adhesive function and a reflective function. According to another embodiment, the first resin part 2130 and the second resin part 2135 may be provided with the same material.

The molding part 140 may be disposed around the light emitting device 120. The molding part 140 may be disposed around the light emitting device 120 and may be disposed such that an outer area of the upper surface of the second resin part 2135 is exposed. The width of the lower surface of the molding part 140 may be provided smaller than the width of the upper surface of the first package body 110.

According to the embodiment, the first and second conductive layers 321 and 322 may be filled in the first and second openings TH1 and TH2.

In addition, according to another embodiment, it is possible to be provided in a state that the first and second conductive layers 321 and 322 may not be filled in the first and second openings TH1 and TH2, and the conductive layers may be filled in the first and second openings TH1 and TH2 while the first package body 110 is mounted on a circuit board or the like.

Meanwhile, the first and second resin parts 2130 and 2135 may be formed of at least one material selected from a group including the first resin part 130, the second resin part 135, the molding part 140, and the adhesive described above. The first and second resin parts 2130 and 2135 may comprise an adhesive function, a reflective function, and the like.

Further, according to the embodiment, the vertical cross section of the first and second openings TH1 and TH2 may be provided in an asymmetrical polygonal shape.

For example, the inclination angle of the inclined surfaces facing each other of the first and second openings TH1 and TH2 with respect to the bottom surface of the body 110 may be provided to be perpendicular. In addition, the inclined surface disposed outside the first and second openings may be provided in a two-step shape, and the inclination angle of the inclined surface disposed at upper portion and the inclination angle of the inclined surface disposed at lower portion with respect to the bottom surface of the body may be provided different from each other. For example, the inclination angle of the inclined surface disposed at the upper portion with respect to the bottom surface of the body 110 may be provided vertically, and the inclination angle of the inclined surface disposed at the lower portion with respect to the bottom surface of the body 110 may be provided at an acute angle.

Since the shapes of the first and second openings TH1 and TH2 are provided as described above, the first and second conductive layers 321 and 322 can be easily formed in the first and second openings TH1 and TH2.

Next, referring to FIG. 17, another example of the light emitting device package according to the embodiment will be described. FIG. 17 is a view showing still another example of the light emitting device package according to the embodiment.

In describing a light emitting device package according to an embodiment, descriptions overlapping with those described above may be omitted.

The light emitting device package according to the embodiment may comprise a molding part 140 disposed on the first package body 110 as shown in FIG. 17. The first package body 110 may comprise first and second openings TH1 and TH2 passing through from the upper surface to the lower surface thereof.

For example, the first opening TH1 may be provided in the first frame 111. Also, the second opening TH2 may be provided in the second frame 112.

In addition, the light emitting device package according to the embodiment may comprise the light emitting device 120 comprising the first bonding part 121 and the second bonding part 122. The first and second bonding parts 121 and 122 may be disposed on the first and second openings TH1 and TH2, respectively.

A first resin part 2130 and a second resin part 2135 may be provided between the light emitting device 120 and the first package body 110. The first resin part 2130 may be disposed between the first bonding part 121 and the second bonding part 122. The first resin part 2130 may be diffused and disposed under the lower surface of the light emitting device 120. The second resin part 2135 may be disposed on the side surfaces of the first and second bonding parts 121 and 122. The second resin part 2135 may be disposed around the first and second bonding parts 121 and 122.

The light emitting device 120 and the first package body 110 can be stably fixed by the first resin part 2130 and the second resin part 2135. The peripheries of the first and second bonding parts 121 and 122 may be sealed by the first resin part 2130 and the second resin part 2135. Also, the first and second openings TH1 and TH2 may be sealed by the first resin part 2130 and the second resin part 2135.

The first resin part 2130 and the second resin part 2135 may comprise different materials each other. The first resin part 2130 and the second resin part 2135 may comprise an adhesive function and a reflective function. According to another embodiment, the first resin part 2130 and the second resin part 2135 may be provided with the same material.

The molding part 140 may be disposed around the light emitting device 120. The molding part 140 may be disposed around the light emitting device 120 and around the second resin part 2135, and may be disposed on a side surface of the first package body 110. The width of the lower surface of the molding part 140 may be provided larger than the width of the upper surface of the first package body 110.

A portion of the molding part 140 may be disposed in direct contact with the second resin part 2135. In addition, another portion of the molding part 140 may be disposed in direct contact with the first package body 110.

According to the embodiment, the first and second conductive layers 321 and 322 may be filled in the first and second openings TH1 and TH2.

In addition, according to another embodiment, it is possible to be provided in a state that the first and second conductive layers 321 and 322 may not be filled in the first and second openings TH1 and TH2, and the conductive layers may be filled in the first and second openings TH1 and TH2 while the first package body 110 is mounted on a circuit board or the like.

Meanwhile, the first and second resin parts 2130 and 2135 may comprise at least one selected from a group including the first resin part 130, the second resin part 135, the molding part 140, and the adhesive described above. The first and second resin parts 2130 and 2135 may comprise an adhesive function, a reflective function, and the like.

Further, according to the embodiment, the vertical cross section of the first and second openings TH1 and TH2 may be provided in an asymmetrical polygonal shape.

For example, the first and second openings TH1 and TH2 may be provided with inner and outer inclined surfaces, respectively, in a two-step shape, and the inclination angle of the inclined surface disposed at upper portion and the inclination angle of the inclined surface disposed at lower portion with respect to the bottom surface of the body may be provided different from each other. For example, the inclination angle of the inclined surface disposed at the upper portion with respect to the bottom surface of the body 110 may be provided vertically, and the inclination angle of the inclined surface disposed at the lower portion with respect to the bottom surface of the body 110 may be provided at an acute angle. In addition, the inclination angle of the inclined inner surfaces facing each other disposed at the lower portion with respect to the bottom surface of the body 110 may be provided to be larger than the inclination angle of the inclined outer surface.

Since the shapes of the first and second openings TH1 and TH2 are provided as described above, the first and second conductive layers 321 and 322 can be easily formed in the first and second openings TH1 and TH2.

Next, referring to FIG. 18, another example of the light emitting device package according to the embodiment will be described. FIG. 18 is a view showing still another example of the light emitting device package according to the embodiment.

In describing the light emitting device package according to the embodiment referring to FIG. 18, descriptions overlapping with those described above may be omitted.

The light emitting device package according to the embodiment may comprise a second package body 150 and a light emitting device 120. The light emitting device 120 may comprise first and second bonding parts 121 and 122.

The first and second bonding parts 121 and 122 may each comprise a protrusion. The protrusions of the first and second bonding parts 121 and 122 may be provided, for example, in a circular columnar shape or a polygonal columnar shape. For example, the first and second bonding parts 121 and 122 may comprise an upper portion contacting the light emitting structure 123 and a protruding portion extending downward from the upper portion.

The light emitting device package according to the embodiment may comprise first and second conductive layers 321 and 322. The first conductive layer 321 may be spaced apart from the second conductive layer 322. The first and second conductive layers 321 and 322 may be disposed under the first and second bonding parts 121 and 122, respectively.

The first conductive layer 321 may be disposed under the first bonding part 121. The first conductive layer 321 may be disposed around the protrusion of the first bonding part 121. The second conductive layer 322 may be disposed under the second bonding part 122. The second conductive layer 322 may be disposed around the protrusion of the second bonding part 122.

The first and second conductive layers 321 and 322 may be coupled with the first and second bonding parts 121 and 122 including the protrusions so that the contact area between the first and second conductive layers 321 and 322 and the first and second bonding parts 121 and 122 can be increased. Accordingly, the physical coupling force and electrical reliability between the first and second conductive layers 321 and 322 and the first and second bonding parts 121 and 122 can be improved.

In addition, the light emitting device package according to the embodiment may comprise the first and second frames 111 and 112. The first and second frames 111 and 112 may be disposed under the second package body 150. For example, the first and second frames 111 and 112 may be coupled to the second package body 150 through an adhesive resin or the like.

A body 113 may be disposed between the first and second frames 111 and 112. According to another embodiment, the body 113 may not be disposed between the first and second frames 111 and 112.

A first portion of the upper surface of the first frame 111 may be disposed under the first bonding part 121. The first portion of the upper surface of the first frame 111 may be overlapped with the first bonding part 121 in the vertical direction. The first portion of the upper surface of the first frame 111 may be disposed under the protrusion of the first bonding part 121.

A second portion of the upper surface of the first frame 111 may be disposed under the lower surface of the second package body 150. The second portion of the upper surface of the first frame 111 may be overlapped with the lower surface of the second package body 150 in the vertical direction. For example, the upper surface of the first frame 111 may be bonded to the lower surface of the second package body 150 through an adhesive resin.

A first portion of the upper surface of the second frame 112 may be disposed under the second bonding part 122. The first portion of the upper surface of the second frame 112 may be overlapped with the second bonding part 122 in the vertical direction. The first portion of the upper surface of the second frame 112 may be disposed under the protrusion of the second bonding part 122.

In addition, a second portion of the upper surface of the second frame 112 may be disposed under the lower surface of the second package body 150. The second portion of the upper surface of the second frame 112 may be overlapped with the lower surface of the second package body 150 in the vertical direction. For example, the upper surface of the second frame 112 may be bonded to the lower surface of the second package body 150 through an adhesive resin.

According to an embodiment, the first and second frames 111 and 112 may extend to the end of the side wall of the second package body 150. The side surface of the first frame 111 and a side surface of the second package body 150 may be provided on the same plane. In addition, the side surface of the second frame 112 and the other side surface of the second package body 150 may be provided on the same plane.

The first and second frames 111 and 112 may provide a function of a lead frame. The first and second frames 111 and 112 may be electrically connected to the first and second bonding parts 121 and 122, respectively.

In addition, the light emitting device package according to the embodiment may comprise a first resin 130. The first resin 130 may provide a stable fixing force between the light emitting device 120 and the first and second frames 111 and 112 and the body 113.

For example, the first resin 130 may be moved into and disposed on the periphery of the first and second bonding parts 121 and 122 and a region under the light emitting device 120. In addition, the first resin 130 may be disposed around the first and second conductive layers 321 and 322.

According to the embodiment, the first resin 130 may provide a kind of first and second openings, respectively, around the first and second bonding parts 121 and 122, respectively. Accordingly, the protrusions of the first and second bonding parts 121 and 122 may be disposed in the first and second openings, respectively. Also, the first and second conductive layers 321 and 322 may be provided around the protrusions of the first and second bonding parts 121 and 122 in the first and second openings, respectively.

In addition, when a space where the first resin 130 can be provided is sufficiently secured between the light emitting device 120 and the body 113, a recess may not be provided on the upper surface of the body 113.

Meanwhile, according to the embodiment, the first resin 130 and the second package body 150 may be provided with the same material.

The light emitting device package according to the embodiment may be mounted on a submount, a circuit board, or the like. At this time, the first and second frames 111 and 112 may be electrically connected to the first and second pads provided on the submount, the circuit board, and the like, respectively.

In the light emitting device package according to the embodiment, power can be connected to the first bonding part 121 through the first frame 111 and the first conductive layer 321, and power can be connected to the second bonding part 122 through the second frame 112 and the second conductive layer 322.

Accordingly, the light emitting device 120 can be driven by the driving power supplied through the first bonding part 121 and the second bonding part 122. In addition, the light emitted from the light emitting device 120 can be provided in the upper direction of the second package body 150.

However, when the conventional light emitting device package is mounted on a sub-mount or a circuit board, a high temperature process such as a reflow may be applied. At this time, in the reflow process, a re-melting phenomenon occurs in the bonding region between the lead frame and the light emitting device provided in the light emitting device package, so that the stability of the electrical connection and the physical coupling may be weakened.

However, according to the light emitting device package and the method of manufacturing the light emitting device package of the embodiment, the first bonding part of the light emitting device according to the embodiment may receive driving power through the conductive layer disposed in the opening. And, the melting point of the conductive layer disposed in the opening may be selected to have a higher value than the melting point of the common bonding material.

Therefore, even when the light emitting device package 100 according to the embodiment is bonded to the main board through a reflow process, re-melting phenomenon does not occur, so that there is an advantage that electrical connection and physical bonding force are not deteriorated.

In addition, according to the light emitting device package and the method of manufacturing the light emitting device package of the embodiment, the second package body 150 and the body 113 do not need to be exposed to high temperatures in the process of manufacturing the light emitting device package. Therefore, according to the embodiment, it is possible to prevent the second package body 150 and the body 113 from being exposed to high temperatures to be damaged or discolored.

Accordingly, the selection range for the materials constituting the second package body 150 and the body 113 can be widened. According to the embodiment, the second package body 150 and the body 113 may be provided using a relatively inexpensive resin material as well as expensive materials such as ceramics.

For example, the package body 150 and the body 113 may comprise at least a material selected from a group including a polyphthalamide (PPA) resin, a PolyCyclohexylenedimethylene Terephthalate (PCT) resin, an Epoxy Molding Compound (EMC) resin, and a Silicone Molding Compound (SMC) resin.

Meanwhile, in the above description, the case where the second package body 150 comprises the cavity C has been described. The light emitting device 120 may be disposed in the cavity C. However, according to another embodiment, as shown in FIG. 19, the second package body 150 may be provided in a form not including a cavity. For example, the second package body 150 may do not include a cavity, and may be provided in a flat top surface.

The side surface of the second package body 150 and the side surface of the first frame 111 may be provided on the same plane. In addition, the other side surface of the second package body 150 and the side surface of the second frame 112 may be provided on the same plane.

In addition, in the above description, the case where the first and second frames 111 and 112 disposed on the lower surface of the second package body 150 are extended to the side surface of the second package body 150 has been described. However, the first and second frames 111 and 112 disposed on the lower surface of the second package body 150 may do not extend to the side surface of the second package body 150, may be disposed only on a portion of the lower surface of the second package body 150, and may be arranged overlapping with the cavity C in the vertical direction.

Meanwhile, the first resin 130 may be disposed on a side surface of the light emitting device 120. This is because the first resin 130 can ride on the side surface of the light emitting device 120 due to the OH⁻ provided on the surface of the light emitting device 120. At this time, if the thickness of the first resin 130 provided on the side surface of the light emitting device 120 is too thick, the light intensity Po may be lowered, so that control of an appropriate thickness is required. In addition, since the first resin 130 can be disposed on the side surface of the light emitting device 120, a double protective film structure can be provided, and there is an advantage that moisture resistance can be improved, and the light emitting device 120 can be protected from other contaminants.

In addition, when the first resin 130 is provided under and around the light emitting device 120, for example, the first resin 130 may be provided through a centrifugal separation method or the like. The first resin 130 may be applied to the second package body 150 and the first resin 130 may be diffused and supplied to the lower and peripheral regions of the light emitting device 120 through centrifugal separation. As such, when the centrifugal separation method or the like is applied, the reflective material contained in the first resin 130 can be settled to the lower region. Accordingly, only a kind of clear molding part is disposed on the side of the active layer of the light emitting device 120, and the reflective material can be disposed in a lower portion than the active layer of the light emitting device 120, so that light intensity Po can be more improved.

And, according to the embodiment, by selecting the physical properties of the first resin 130 in consideration of the Coefficient of Thermal Expansion (CTE) matching between the second package body 150, the first resin 130, and the light emitting device 120, it is possible to improve the problem of cracking or peeling due to thermal shock.

The features, structures, effects and the like described in the above embodiments are included in at least one embodiment and are not limited to one embodiment only. Further, with respect to the features, structures, effects, and the like described in the embodiments, other embodiments may be carried out with combinations or modifications by those having ordinary skill in the art. Accordingly, the contents relevant to the combinations and modifications should be construed as being included in the scope of the embodiments.

Although preferable embodiments have been proposed and set forth in the aforementioned description, the present invention should not be construed as limited thereto. It will be apparent that various deformations and modifications not illustrated are available within the scope without departing from inherent features of the embodiment of the present invention by any one having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

According to the embodiments, it is possible to provide a light emitting device package, a method of manufacturing the same, and a light source device including the same, which can efficiently match an optimum specification for each product even when a different form factor is required for each output.

In addition, according to the embodiments, it is possible to provide a light emitting device package capable of improving bonding strength between a package body and a light emitting device, a method of manufacturing the same, and a light source device including the same.

Further, in the embodiments, attraction force according to the magnetic force (FM) is generated between the first magnetic material layer of the first package body and the second magnetic material layer on the second package body, so that the second magnetic material layer of the second package body can be self-aligned to the coupling groove of the first package body, but also be self-attached by the magnetic force, so that there is a technical effect capable of self-alignment and self-attachment between the first package body and the second package body.

In addition, according to the embodiments, it is possible to provide a light emitting device package having an excellent electrical and physical reliability in a bonding region between an electrode of a package body and an electrode of a light emitting device, a method of manufacturing the same, and a light source device including the same.

For example, according to the light emitting device package and the method of manufacturing the light emitting device of the embodiments, there is an advantage that re-melting phenomenon can be prevented from occurring in the bonding region of the light emitting device package while the light emitting device package is re-bonded to a substrate or the like.

In addition, according to the embodiments, it is possible to provide a light emitting device package capable of providing a high output and excellent thermal and electrical reliability, a method of manufacturing the same, and a light source device including the same.

In addition, according to the embodiments, it is possible to provide a light emitting device package capable of improving brightness, a method of manufacturing the same, and a light source device including the same.

In addition, according to the embodiments, it is possible to provide a light emitting device package, a method of manufacturing the same, and a light source device including the same, which can reduce manufacturing cost and improve manufacturing yield by improving process efficiency and changing a structure.

The technical effects of the embodiments are not limited to the matters described in this item and include those that can be understood through the description of the invention.

The invention claimed is:

1. A light emitting device package, comprising:
a first package body;
a second package body disposed on the first package body, and comprising an opening passing through an upper surface and a lower surface of the second package body; and
a light emitting device disposed in the opening, and comprising a first bonding part and a second bonding part,
wherein the first package body comprises a first opening and a second opening that pass through an upper surface and a lower surface of the first package body,
wherein the upper surface of the first package body is coupled with the lower surface of the second package body,
wherein the first bonding part is disposed on the first opening and the second bonding part is disposed on the second opening,
wherein the first package body comprises a first frame, a second frame, and a body disposed between the first frame and the second frame,
wherein the first frame comprises the first opening and a first upper recess spaced from the first opening towards a first side of the first package body,
wherein the second frame comprises the second opening and a second upper recess spaced from the second opening towards a second side of the first package body opposite to the first side, and
wherein a second resin part is disposed in the first and second upper recesses and protrudes under the light emitting device and seals outer side surfaces of the first and second bonding parts.

2. The light emitting device package of claim 1, further comprising an adhesive layer disposed between the first package body and the second package body.

3. The light emitting device package of claim 1,
wherein the body comprises a recess, and wherein a first resin part is provided in the recess of the body, and contacts a lower surface of the light emitting device.

4. The light emitting device package of claim 1, wherein at least one of the first package body and the second package body comprises a phosphor.

5. The light emitting device package of claim 1, wherein at least one of the first package body and the second package body comprises a transparent resin.

6. The light emitting device package of claim 1, wherein at least one of the first package body and the second package body comprises a reflective resin.

7. The light emitting device package of claim 2, wherein the first package body comprises a coupling groove, and
wherein the second package body comprises a coupling protrusion.

8. The light emitting device package of claim 7, wherein the adhesive layer comprises a first adhesive layer disposed in the coupling groove, and a second adhesive layer disposed on the first package body.

9. A light emitting device package, comprising
a first package body comprising first and second frames spaced apart from each other, and a body supporting the first and second frames;
a light emitting device disposed on the first package body;
a second package body surrounding the light emitting device and disposed on the first package body; and
an adhesive layer disposed between the first package body and the second package body,
wherein the body comprises an opening,
wherein the light emitting device package comprises a heat dissipation member provided in the opening,
wherein the first frame comprises a first upper recess spaced from the opening towards a first side of the first package body,
wherein the second frame comprises a second upper recess spaced from the opening towards a second side of the first package body opposite to the first side, and
wherein a second resin part is disposed in the first and second upper recesses and protrudes under the light emitting device and seals outer side surfaces of first and second bonding parts bonding the light emitting device to the first package body.

10. The light emitting device package of claim 9, wherein the first package body comprises a coupling groove,
wherein the second package body comprises a coupling protrusion,
wherein the adhesive comprises a first adhesive layer disposed in the coupling groove, and a second adhesive layer disposed on the body of the first package body.

11. A light emitting device package, comprising:
a first package body comprising a first frame, a second frame, and a body disposed between the first frame and the second frame;
a second package body disposed on the first package body, and comprising an opening passing through an upper surface and a lower surface of the second package body;
a light emitting device disposed on the first package body, and comprising a first bonding part and a second bonding part; and
an adhesive layer disposed between the first package body and the second package body,
wherein the first frame comprises a first opening overlapping with the first bonding part in a first direction perpendicular to an upper surface of the body,
wherein the second frame comprises a second opening overlapping with the second bonding part in the first direction,
wherein the body overlaps with the light emitting device in the first direction and comprises a recess provided between the first opening and the second opening,
wherein the body comprises a coupling groove overlapping with the second package body in the first direction,
wherein a width of an upper portion of the first opening is less than a width of the first bonding part,
wherein a width of a lower portion of the first opening is wider than the width of the upper portion of the first opening and gradually inclines to the width of the upper portion of the first opening,
wherein a width of an upper portion of the second opening is less than a width of the second bonding part, and
wherein a width of a lower portion of the second opening is wider than the width of the upper portion of the second opening and gradually inclines to the width of the upper portion of the second opening.

12. The light emitting device package of claim 11, wherein the first opening passes through an upper surface and a lower surface of the first frame, and
wherein the second opening passes through an upper surface and a lower surface of the second frame.

13. The light emitting device package of claim 11, wherein the second package body comprises a coupling protrusion coupled to the coupling groove provided on the body of the first package body.

14. The light emitting device package of claim 13, wherein the adhesive is provided between the coupling groove and the coupling protrusion.

15. The light emitting device package of claim 11, further comprising:
a first conductive layer provided in the first opening and contacting a lower surface of the first bonding part; and
a second conductive layer provided in the second opening and contacting a lower surface of the second bonding part.

16. The light emitting device package of claim 11, further comprising:
a first resin part provided in the recess of the body, and contacting a lower surface of the light emitting device.

17. The light emitting device package of claim 11, further comprising:
a first upper recess and a second upper recess provided on an upper surface of the body; and
a second resin part provided in the first and second upper recesses and protruding under the light emitting device and sealing outer side surfaces of the first and second bonding parts.

18. The light emitting device package of claim 11, wherein at least one of the first package body and the second package body comprises a phosphor.

19. The light emitting device package of claim 11, wherein at least one of the first package body and the second package body comprises a transparent resin.

20. The light emitting device package of claim 11, wherein at least one of the first package body and the second package body comprises a reflective resin.

* * * * *